United States Patent [19]
Hokazono

[11] Patent Number: 6,011,411
[45] Date of Patent: Jan. 4, 2000

[54] CMOS LOGIC CIRCUIT WITH REDUCED CIRCUIT AREA

[75] Inventor: Hisakazu Hokazono, Kasugai, Japan

[73] Assignee: Fujitsu Limited, Kanagawa, Japan

[21] Appl. No.: 08/926,450

[22] Filed: Sep. 10, 1997

[30] Foreign Application Priority Data

Feb. 18, 1997 [JP] Japan ..................................... 9-033853

[51] Int. Cl.[7] .......................... H03K 19/094; H03K 17/16
[52] U.S. Cl. .............................. 326/113; 326/121; 326/31
[58] Field of Search ..................................... 326/121, 113, 326/33, 114, 115, 31

[56] References Cited

U.S. PATENT DOCUMENTS 4,541,067  9/1985  Whitaker .................................. 326/113
4,559,609  12/1985  Robinson, Jr. et al. ................. 326/113
4,710,649  12/1987  Lewis ...................................... 326/113

*Primary Examiner*—Michael Tokar
*Assistant Examiner*—Richard Roseen
*Attorney, Agent, or Firm*—Nikaido Marmelstein Murray & Oram LLP

[57] ABSTRACT

A logic circuit that requires less circuit area is described. The circuit includes a plurality of MOS transistors. The MOS transistors operate to produce an output signal having either the level of one input signal of a plurality of input signals or the potential of a power supply in response to an another at least one of the input signals.

16 Claims, 18 Drawing Sheets

Fig.1 (Prior Art)
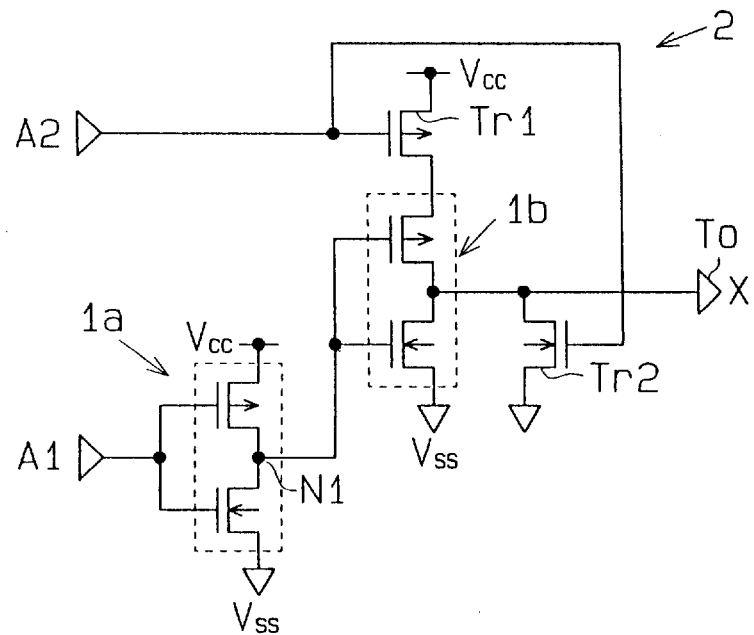
Fig.2 (Prior Art)
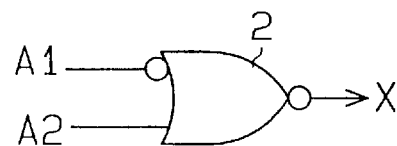
Fig.3 (Prior Art)
| A1 | A2 | X |
|----|----|---|
| 0  | 0  | L |
| 0  | 1  | L |
| 1  | 0  | H |
| 1  | 1  | L |

Fig.4 (Prior Art)
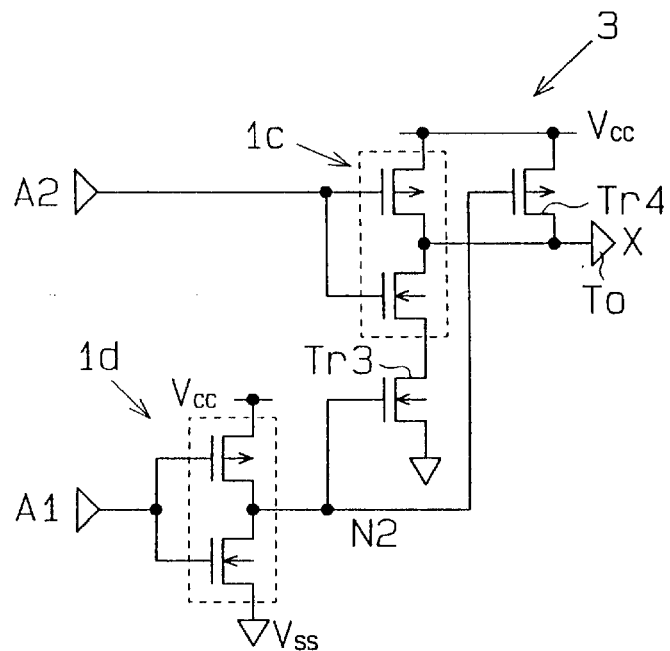
Fig.5 (Prior Art)
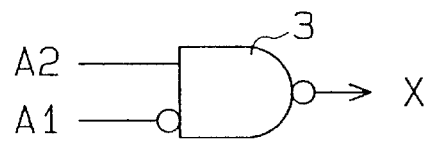
Fig.6 (Prior Art)
| A1 | A2 | X |
|----|----|---|
| 0  | 0  | H |
| 0  | 1  | L |
| 1  | 0  | H |
| 1  | 1  | H |

| A1 | A2 | A3 | X |
|----|----|----|---|
| 0 | 0 | 0 | L |
| 1 | 0 | 0 | L |
| 0 | 1 | 0 | L |
| 1 | 1 | 0 | L |
| 0 | 0 | 1 | H |
| 1 | 0 | 1 | L |
| 0 | 1 | 1 | H |
| 1 | 1 | 1 | H |

| A1 | A2 | A3 | X |
|----|----|----|---|
| 0  | 0  | 0  | L |
| 1  | 0  | 0  | L |
| 0  | 1  | 0  | H |
| 1  | 1  | 0  | L |
| 0  | 0  | 1  | H |
| 1  | 0  | 1  | H |
| 0  | 1  | 1  | H |
| 1  | 1  | 1  | H |

| A1 | A2 | A3 | X |
|----|----|----|---|
| 0 | 0 | 0 | L |
| 1 | 0 | 0 | L |
| 0 | 1 | 0 | L |
| 1 | 1 | 0 | L |
| 0 | 0 | 1 | L |
| 1 | 0 | 1 | L |
| 0 | 1 | 1 | H |
| 1 | 1 | 1 | L |

| A1 | A2 | A3 | X |
|----|----|----|---|
| 0  | 0  | 0  | H |
| 1  | 0  | 0  | L |
| 0  | 1  | 0  | H |
| 1  | 1  | 0  | H |
| 0  | 0  | 1  | H |
| 1  | 0  | 1  | H |
| 0  | 1  | 1  | H |
| 1  | 1  | 1  | H |

CMOS LOGIC CIRCUIT WITH REDUCED CIRCUIT AREA

BACKGROUND OF THE INVENTION

1. Field of the Invention

The present invention relates to a CMOS logic circuit, and, more particularly, the invention relates to a CMOS logic circuit with reduced circuit area.

2. Description of the Related Art

Multiple CMOS logic circuits are used in a semiconductor device like a microcomputer or ASIC (Application Specific IC). In accordance with the recent trend of ensuring higher integration of semiconductor devices and reducing power consumption, it is more and more essential to reduce the number of elements and the power consumption of such CMOS logic circuits.

First Prior Art

FIG. 1 shows a 2-input NOR gate with a CMOS structure. An input signal A1 is input to a CMOS inverter 1a. The CMOS inverter 1a emits a signal from a node N1 to a CMOS inverter 1b.

The source of a P channel MOS transistor (hereinafter referred to as "PMOS transistor") of the inverter 1b is connected to a high potential power supply $V_{CC}$ via a PMOS transistor Tr1. An input signal A2 is input to the gate of the transistor Tr1.

The output signal of the inverter 1b is sent out as an output signal X from an output terminal To. The output terminal To is connected to a low-potential power supply $V_{SS}$ via an N channel MOS transistor (hereinafter referred to as "NMOS transistor") Tr2. The input signal A2 is input to the gate of the transistor Tr2.

The logic circuit operates based on truth values shown in FIG. 3 and constitutes a NOR gate 2 represented by a symbol shown in FIG. 2. That is, the 2-input NOR gate generates an NOR logic signal, from the inverted signal of the input signal A1 at the node N1 and the input signal A2, as an output signal X.

The operation of the 2-input NOR gate 2 will be specifically described below. When the input signals A1 and A2 both have L (Low) levels or "0", the transistor Tr1 is turned on and the transistor Tr2 is turned off.

The node N1 has an H (High) level and the PMOS transistor of the inverter 1b is turned off and the NMOS transistor of the inverter 1b is turned on. As a result, the output signal X has an L level regardless of the ON action of the transistor Tr1.

When the input signal A1 is "0" and the input signal A2 has an H level or is "1", the transistor Tr1 is turned off and the transistor Tr2 is turned on. Further, the node N1 has an H level. Therefore, the output signal X has an L level.

When the input signal A1 is "1" and the input signal A2 is "0", the transistor Tr1 is turned on and the transistor Tr2 is turned off. Further, the node N1 has an L level. Therefore, the output signal X has an H level.

When the input signals A1 and A2 both is "1", the transistor Tr1 is turned off and the transistor Tr2 is turned on. Further, the node N1 has an L level. Therefore, the output signal X has an L level.

This NOR gate 2 requires a total of six transistors, which are four transistors for outputting a NOR logic and two transistors of the inverter 1a for inverting the input signal A1. That is, 4n-2 transistors, where n is the number of inputs, are needed.

Second Prior Art

FIG. 4 shows a 2-input NAND gate with a CMOS structure. An input signal A2 is input to a CMOS inverter 1c. The CMOS inverter 1c emits the output signal X to an output terminal To.

An input signal A1 is input to a CMOS inverter 1d. The CMOS inverter 1d outputs a signal from a node N2 to the gates of an NMOS transistor Tr3 and a PMOS transistor Tr4.

The transistor Tr3 is connected between an NMOS transistor of the inverter 1c and a low potential power supply $V_{SS}$. The transistor Tr4 is connected between the output terminal To and a high potential power supply $V_{CC}$.

The logic circuit operates based on truth values shown in FIG. 6 and constitutes a NAND gate 3 represented by a symbol shown in FIG. 5. That is, the logic circuit generates an NAND logic signal, from the inverted signal of the input signal A1 at the node N2 and the input signal A2, as an output signal X.

The operation of the thus constituted 2-input NAND gate will now be described. When the input signals A1 and A2 both are "0", the node N2 has an H level so that the transistor Tr3 is turned on while the transistor Tr4 is turned off. Further, the PMOS transistor of the inverter 1c is turned on, and NMOS transistor of the inverter 1c is turned off. Therefore, the output signal X has an H level regardless of the ON action of the transistor Tr3.

When the input signal A1 is "0" and the input signal A2 is "1", the node N2 has an H level so that the transistor Tr3 is turned on while the transistor Tr4 is turned off. Further, the PMOS transistor and NMOS transistor of the inverter 1c are respectively turned off and on, so that the output signal X has an L level.

When the input signal A1 is "1" and the input signal A2 is "0", the node N2 has an L level so that the transistor Tr3 is turned off and the transistor Tr4 is turned on. Further, the PMOS transistor of the inverter 1c is turned on, so that the output signal X has an H level.

When the input signals A1 and A2 both are "1", the node N2 has an L level so that the transistor Tr3 is turned off and the transistor Tr4 is turned on. Therefore, the output signal X has an H level irrespective of the operation of the inverter 1c.

This NAND gate 3 requires a total of six transistors, four transistors for outputting a NAND logic and two transistors of the inverter 1d for inverting the input signal A1. That is, 4n-2 transistors, where n is the number of inputs, are needed.

Third Prior Art

FIG. 7 shows a 2-wide, 2-AND, 3-input AND-OR-INVERT gate 4 with a CMOS structure. An input signal A3 is input to a CMOS inverter 1e. The CMOS inverter 1e emits a signal from a node N3 to the gates of a PMOS transistor Tr5 and an NMOS transistor Tr8.

An input signal A2 is input to a CMOS inverter 1f. The CMOS inverter 1f emits a signal from a node N4 to an inverter 1g. The output signal of the inverter 1g is sent out as the output signal X from an output terminal To.

The transistor Tr5 is connected between the inverter 1g and a high potential power supply $V_{CC}$. The transistor Tr8 is connected between the output terminal To and a low-potential power supply $V_{SS}$.

An input signal A1 is input to the gates of an NMOS transistor Tr6 and a PMOS transistor Tr7. The transistor Tr6 is connected between the inverter 1g and the low-potential power supply $V_{SS}$. The transistor Tr7 is connected between the drain of the transistor Tr5 and the output terminal To.

The AND-OR-INVERT gate 4 performs an operation based on truth values shown in FIG. 9 and is represented by a symbol shown in FIG. 8. That is, the AND-OR-INVERT gate 4 generates an AND logic signal from the input signal A1 and the inverted signal of the input signal A2. The AND-OR-INVERT gate 4 further generates an NOR logic signal, from the AND logic signal and the inverted signal of the input signal A3, as an output signal X.

When the input signals A1, A2 and A3 all are "0", the transistor Tr6 is turned off and the transistor Tr7 is turned on. When the node N3 has an H level, the transistor Tr5 is turned off and the transistor Tr8 is turned on. Therefore, the inverter 1g becomes disabled so that an L level output signal X is output by the ON action of the transistor Tr8.

When the input signals A1, A2 and A3 are "1, 0, 0", the transistor Tr6 is turned on and the transistor Tr7 is turned off. When the node N3 has an H level, the transistor Tr5 is turned off and the transistor Tr8 is turned on. As a result, the node N4 has an H level, so that an L level output signal X is output by the operation of the inverter 1g and the ON action of the transistor Tr8

When the input signals A1, A2 and A3 are "0, 1, 0", the transistor Tr6 is turned off and the transistor Tr7 is turned on. When the node N3 has an H level, the transistor Tr5 is turned off and the transistor Tr8 is turned on. Therefore, the inverter 1g becomes disabled so that the output signal X has an L level by the ON action of the transistor Tr8.

When the input signals A1, A2 and A3 are "1, 1, 0", the transistor Tr6 is turned on and the transistor Tr7 is turned off. Because the node N3 has an H level, the transistor Tr5 is turned off and the transistor Tr8 is turned on. Although the node N4 has an L level, the inverter 1g becomes disabled because of the transistor Tr5 being turned off. Therefore, an output signal X has an L level by the ON action of the transistor Tr8.

When the input signals A1, A2 and A3 are "0, 0, 1", the transistor Tr6 is turned off and the transistor Tr7 is turned on. Because the node N3 has an L level, the transistor Tr5 is turned on and the transistor Tr8 is turned off. Although the node N4 has an H level, the inverter 1g becomes disabled because of the OFF action of the transistor Tr6. Therefore, an output signal X has an H level by the ON actions of the transistors Tr5 and Tr7.

When the input signals A1, A2 and A3 are "1, 0, 1", the transistor Tr6 is turned on and the transistor Tr7 is turned off. When the node N3 has an L level, the transistor Tr5 is turned on and the transistor Tr8 is turned off. Consequently, the node N4 has an H level, so that an output signal X has an L level by the ON action of the transistor Tr6 and the operation of the inverter 1g.

When the input signals A1, A2 and A3 are "0, 1, 1", the transistor Tr6 is turned off and the transistor Tr7 is turned on. Since the node N3 has an L level, the transistor Tr5 is turned on and the transistor Tr8 is turned off. Consequently, the node N4 has an L level, so that an output signal X has an H level by the ON actions of the transistors Tr5 and Tr7 and the operation of the inverter 1g.

When the input signals A1, A2 and A3 are "1, 1, 1", the transistor Tr6 is turned on and the transistor Tr7 is turned off. When the node N3 has an L level, the transistor Tr5 is turned on and the transistor Tr8 is turned off. Consequently, the node N4 has an L level, so that an output signal X has an H level by the ON action of the transistor Tr5 and the operation of the inverter 1g.

This AND-OR-INVERT gate 4 requires a total of ten transistors, six transistors for outputting an AND-OR-INVERT logic and four transistors of the inverters 1e and 1f for inverting the input signals A2 and A3.

Fourth Prior Art

FIG. 10 shows a 2-wide, 2-OR, 3-input OR-AND gate 5 with a CMOS structure. An input signal A1 is input to a CMOS inverter 1h. The CMOS inverter 1h emits a signal from a node N5 to a CMOS inverter 1i. The CMOS inverter 1i emits the output signal from a node N6 to a CMOS inverter 1j which outputs the output signal X.

An input signal A2 is input to the gates of a PMOS transistor Tr9 and an NMOS transistor Tr12. An input signal A3 is input to the gates of an NMOS transistor Tr10 and a PMOS transistor Tr11.

The transistor Tr9 is connected between the inverter 1i and a power supply $V_{CC}$, and the transistor Tr10 is connected between the inverter 1i and a low-potential power supply $V_{SS}$. The transistor Tr11 is connected between the node N6 and the high potential power supply $V_{CC}$, and the transistor Tr12 is connected between the node N6 and the drain of the transistor Tr10.

The OR-AND gate 5, like the third prior art example, performs an operation based on truth values shown in FIG. 9 and is represented by a symbol shown in FIG. 11. That is, the OR-AND gate 5 generates an OR logic signal, from the inverted signal of the input signal A1 and the input signal A2. The OR-AND gate 5 further generates an AND logic signal, from the OR logic signal and the input signal A3, as an output signal X.

When the input signals A1, A2 and A3 all are "0", the node N5 has an H level. The transistor Tr9 is turned on and the transistor Tr12 is turned off. Further, the transistor Tr10 is turned off and the transistor Tr11 is turned on. Because the transistor Tr10 is turned off, the inverter 1i becomes disabled and the node N6 has an H level based on the ON action of the transistor Tr11. Therefore, the output signal X has an L level.

When the input signals A1, A2 and A3 are "1, 0, 0", the node N5 has an L level. The transistor Tr9 is turned on and the transistor Tr12 is turned off. Further, the transistor Tr10 is turned off and the transistor Tr11 is turned on. The node N6 has an H level based on the ON action of the transistor Tr11 and the operation of the inverter 1i based on the ON action of the transistor Tr9. Therefore, the output signal X has an L level.

When the input signals A1, A2 and A3 are "0, 1, 0", the node N5 has an H level. The transistor Tr9 is turned off and the transistor Tr12 is turned on. Further, the transistor Tr10 is turned off and the transistor Tr11 is turned on. The inverter 1i becomes disabled by the OFF action of the transistor Tr10 and the node N6 has an H level based on the ON action of the transistor Tr11. Therefore, the output signal X has an L level.

When the input signals A1, A2 and A3 are "1, 1, 0", the node N5 has an L level. The transistor Tr9 is turned off and the transistor Tr12 is turned on. Further, the transistor Tr10 is turned off and the transistor Tr11 is turned on. The inverter 1i becomes disabled by the OFF action of the transistor Tr9 and the node N6 has an H level based on the ON action of the transistor Tr11. Therefore, the output signal X has an L level.

When the input signals A1, A2 and A3 are "0, 0, 1", the node N5 has an H level. The transistor Tr9 is turned on and the transistor Tr12 is turned off. Further, the transistor Tr10 is turned on and the transistor Tr11 is turned off. The ON action of the transistor Tr10 enables the inverter 1*i* and causes the node N6 to have an L level. Therefore, an output signal X has an H Level.

When the input signals A1, A2 and A3 are "1, 0, 1", the node N5 has an L level. The transistor Tr9 is turned on and the transistor Tr12 is turned off. Further, the transistor Tr10 is turned on and the transistor Tr11 is turned off. The ON action of the transistor Tr9 enables the inverter 1*i* and causes the node N6 to have an H level. Therefore, the output signal X has an L level.

When the input signals A1, A2 and A3 are "0, 1, 1", the node N5 has an H level. The transistor Tr9 is turned off and the transistor Tr12 is turned on. Further, the transistor Tr10 is turned on and the transistor Tr11 is turned off. The ON action of the transistor Tr10 enables the inverter 1*i* and causes the node N6 to have an L level. Thus, the output signal X has an H level.

When the input signals A1, A2 and A3 all are "1", the node N5 has an L level. The transistor Tr9 is turned off and the transistor Tr12 is turned on. Further, the transistor Tr10 is turned on and the transistor Tr11 is turned off. The inverter 1*i* becomes disabled by the OFF action of the transistor Tr9 and the node N6 have an L level due to the ON actions of the transistors Tr12 and Tr10. The output signal X thus has an H level.

This OR-AND gate 5 requires a total of ten transistors, eight transistors for outputting an OR-AND logic and two transistors of the inverter 1*h* for inverting the input signal A1.

Fifth Prior Art

FIG. 12 shows a 2-wide, 2-AND, 3-input AND-OR gate 6 with a CMOS structure. An input signal A1 is input to a CMOS inverter 1*k*. The CMOS inverter 1*k* emits a signal from a node N7 to a CMOS inverter 1*m*. The output signal of the CMOS inverter 1*m* at a node N8 is output to a CMOS inverter 1*n*. The CMOS inverter 1*n* outputs the output signal X.

An input signal A3 is input to the gates of a PMOS transistor Tr13 and an NMOS transistor Tr16. An input signal A2 is input to the gates of an NMOS transistor Tr14 and a PMOS transistor Tr15. The transistor Tr13 is connected between the inverter 1*m* and a high potential power supply $V_{CC}$, and the transistor Tr14 is connected between the inverter 1*m* and a low-potential power supply $V_{SS}$. The transistor Tr15 is connected between the node N8 and the drain of the transistor Tr13, and the transistor Tr16 is connected between the node N8 and the low-potential power supply $V_{SS}$.

The AND-OR gate 6 performs an operation based on truth values shown in FIG. 14 and is represented by a symbol shown in FIG. 13. That is, the AND-OR gate 6 generates an AND logic signal from the inverted signal of the input signal A1 and the input signal A2. The AND-OR gate 6 further generates an OR logic signal, from the AND logic signal and the input signal A3, as an output signal X.

When the input signals A1, A2 and A3 all are "0", the node N7 has an H level. The transistor Tr13 is turned on and the transistor Tr16 is turned off. Further, the transistor Tr14 is turned off and the transistor Tr15 is turned on. As the transistor Tr14 is turned off, the inverter 1*m* becomes disabled and the node N8 has an H level based on the ON actions of the transistors Tr13 and Tr15. Therefore, the output signal X has an L level.

When the input signals A1, A2 and A3 are "1, 0, 0", the node N7 has an L level. The transistor Tr13 is turned on and the transistor Tr16 is turned off. Further, the transistor Tr14 is turned off and the transistor Tr15 is turned on. The node N8 has an H level based on the ON action of the transistor Tr15 and the operation of the inverter 1*m* based on the ON action of the transistor Tr13. Thus, the output signal X has an L level.

When the input signals A1, A2 and A3 are "0, 1, 0", the node N7 has an H level. The transistor Tr13 is turned on and the transistor Tr16 is turned off. Further, the transistor Tr14 is turned on and the transistor Tr15 is turned off. The ON action of the transistor Tr14 enables the inverter 1*m* and causes the node N8 to have an L level. The output signal X therefore has an H level.

When the input signals A1, A2 and A3 are "1, 1, 0", the node N7 has an L level. The transistor Tr13 is turned on and the transistor Tr16 is turned off. Further, the transistor Tr14 is turned on and the transistor Tr15 is turned off. The ON action of the transistor Tr13 enables the inverter 1*m* and causes the node N8 to have an H level. Therefore, The output signal X has an L level.

When the input signals A1, A2 and A3 are "0, 0, 1", the node N7 has an H level. The transistor Tr13 is turned off and the transistor Tr16 is turned on. Further, the transistor Tr14 is turned off and the transistor Tr15 is turned on. The OFF action of the transistor Tr14 disables the inverter 1*m* and the ON action of the transistor Tr16 causes the node N8 to have an L level. The output signal X therefore has an H level.

When the input signals A1, A2 and A3 are "1, 0, 1", the node N7 has an L level. The transistor Tr13 is turned off and the transistor Tr16 is turned on. Further, the transistor Tr14 is turned off and the transistor Tr15 is turned on. The OFF action of the transistor Tr13 disables the inverter 1*m* and the ON action of the transistor Tr16 causes the node N8 to have an L level. Thus, the output signal X has an H level.

When the input signals A1, A2 and A3 are "0, 1, 1", the node N7 has an H level. The transistor Tr13 is turned off and the transistor Tr16 is turned on. Further, the transistor Tr14 is turned on and the transistor Tr15 is turned off. The ON action of the transistor Tr14 enables the inverter 1*m* and the ON action of the transistor Tr16 causes the node N8 to have an L level. Thus, the output signal X has an H level.

When the input signals A1, A2 and A3 all are "1", the node N7 has an L level. The transistor Tr13 is turned off and the transistor Tr16 is turned on. Further, the transistor Tr14 is turned on and the transistor Tr15 is turned off. The OFF action of the transistor Tr13 disables the inverter 1*m* and the ON action of the transistor Tr16 causes the node N8 to have an L level. The output signal X thus has an H level.

The above-described AND-OR gate 6 requires a total of ten transistors, eight transistors for outputting an AND-OR logic and two transistors of the inverter 1*k* for inverting the input signal A1.

Sixth Prior Art

FIG. 15 shows a 2-wide, 2-OR, 3-input OR-AND-INVERT gate 7 with a CMOS structure. An input signal A1 is input to the gates of a PMOS transistor Tr17 and an NMOS transistor Tr20.

An input signal A2 is input to a CMOS inverter 1*p*. The CMOS inverter 1*p* emits a signal from a node N9 to a CMOS inverter 1*r*. The output signal of the CMOS inverter 1*r* is output as the output signal X. An input signal A3 is input to a CMOS inverter 1*q*. The CMOS inverter 1*q* emits a signal from a node N10 to the gates of a PMOS transistor Tr19 and an NMOS transistor Tr18.

The transistor Tr17 is connected between the inverter 1r and a high potential power supply $V_{CC}$, and the transistor Tr18 is connected between the inverter 1r and a low-potential power supply $V_{SS}$. The transistor Tr19 is connected between the high potential power supply $V_{CC}$ and the output terminal of the inverter 1r, and the transistor Tr20 is connected between the output terminal of the inverter 1r and the drain of the transistor Tr18.

The OR-AND-INVERT gate 7, like the fifth prior art example, performs an operation based on truth values shown in FIG. 14 and is represented by a symbol shown in FIG. 16. That is, the OR-AND-INVERT gate 7 generates an OR logic signal from the input signal A1 and the inverted signal of the input signal A2. The OR-AND-INVERT gate 7 further generates an AND logic signal, from the OR logic signal and the inverted signal of the input signal A3, as an output signal X.

When the input signals A1, A2 and A3 all are "0", the nodes N9 and N10 have H levels. The transistor Tr17 is turned on and the transistor Tr20 is turned off. Further, the transistor Tr18 is turned on and the transistor Tr19 is turned off. As the transistor Tr18 is turned on, the inverter 1r becomes enabled. Therefore, the output signal X has an L level.

When the input signals A1, A2 and A3 are "1, 0, 0", the nodes N9 and N10 have H levels. The transistor Tr17 is turned off and the transistor Tr20 is turned on. Further, the transistor Tr18 is turned on and the transistor Tr19 is turned off. The ON action of the transistor Tr18 enables the inverter 1r and the ON action of the transistor Tr20 causes the output signal X to have an L level.

When the input signals A1, A2 and A3 are "0, 1, 0", the node N9 has an L level and the node N10 has an H level. The transistor Tr17 is turned on and the transistor Tr20 is turned off. Further, the transistor Tr18 is turned on and the transistor Tr19 is turned off. The ON action of the transistor Tr17 enables the inverter 1r and causes the output signal X to have an H level.

When the input signals A1, A2 and A3 are "1, 1, 0", the node N9 has an L level and the node N10 has an H level. The transistor Tr17 is turned off and the transistor Tr20 is turned on. Further, the transistor Tr18 is turned on and the transistor Tr19 is turned off. The OFF action of the transistor Tr17 disables the inverter 1r and the ON actions of the transistors Tr18 and Tr20 cause the output signal X to have an L level.

When the input signals A1, A2 and A3 are "0, 0, 1", the node N9 has an H level and the node N10 has an L level. The transistor Tr17 is turned on and the transistor Tr20 is turned off. Further, the transistor Tr18 is turned off and the transistor Tr19 is turned on. The OFF action of the transistor Tr18 disables the inverter 1r and the ON action of the transistor Tr19 causes the output signal X to have an H level.

When the input signals A1, A2 and A3 are "1, 0, 1", the node N9 has an H level and the node N10 has an L level. The transistor Tr17 is turned off and the transistor Tr20 is turned on. Further, the transistor Tr18 is turned off and the transistor Tr19 is turned on. The OFF action of the transistor Tr18 disables the inverter 1r and the ON action of the transistor Tr19 causes the output signal X to have an H level.

When the input signals A1, A2 and A3 are "0, 1, 1", the nodes N9 and N10 have L levels. The transistor Tr17 is turned on and the transistor Tr20 is turned off. Further, the transistor Tr18 is turned off and the transistor Tr19 is turned on. The ON action of the transistor Tr17 enables the inverter 1r and the ON action of the transistor Tr19 causes the output signal X to have an H level.

When the input signals A1, A2 and A3 all are "1", the nodes N9 and N10 have L levels. The transistor Tr17 is turned off and the transistor Tr20 is turned on. Further, the transistor Tr18 is turned off and the transistor Tr19 is turned on. The OFF action of the transistor Tr17 disables the inverter 1r and the ON action of the transistor Tr19 causes the output signal X to have an H level.

The above-described OR-AND-INVERT gate 7 requires a total of ten transistors, six transistors for outputting an OR-AND-INVERT logic and four transistors of the inverters 1p and 1q for inverting the input signals A2 and A3.

Seventh Prior Art

FIG. 17 shows a 3-input AND gate 8 with a CMOS structure. An input signal A1 is input to a CMOS inverter 1s. The CMOS inverter 1s emits a signal from a node N11 to the gates of an NMOS transistor Tr24 and a PMOS transistor Tr26.

An input signal A2 is input to the gates of an NMOS transistor Tr23 and a PMOS transistor Tr25. An input signal A3 is input to the gates of a PMOS transistor Tr21 and an NMOS transistor Tr22.

The transistor Tr21 has a source connected to a high potential power supply $V_{CC}$ and a drain connected to a node N12. The transistor Tr22 has a drain connected to the node N12 and a source connected to the drain of the transistor Tr23. The source of the transistor Tr23 is connected to the drain of the transistor Tr24 a source of which is connected to the low-potential power supply $V_{SS}$.

The transistor Tr25 has a source connected to the high potential power supply $V_{CC}$ and a drain connected to the node N12. The transistor Tr26 has a source connected to the high potential power supply $V_{CC}$ and a drain connected to the node N12. The node N12 is connected to a CMOS inverter it which sends out the output signal X.

The AND gate 8 performs an operation based on truth values shown in FIG. 19 and is represented by a symbol shown in FIG. 18. That is, the AND gate 8 generates an AND logic signal, from the inverted signal of the input signal A1 and the input signals A2 and A3, as an output signal X.

When the input signals A1, A2 and A3 all are "0", the node N11 has an H level. The transistor Tr24 is turned on and the transistor Tr26 is turned off. Further, the transistor Tr23 is turned off and the transistor Tr25 is turned on. The transistor Tr21 is turned on and the transistor Tr22 is turned off. Therefore, the node N12 has an H level and the output signal X has an L level.

When the input signals A1, A2 and A3 are "1, 0, 0", the node N11 has an L level. The transistor Tr24 is turned off and the transistor Tr26 is turned on. Further, the transistor Tr23 is turned off and the transistor Tr25 is turned on. The transistor Tr21 is turned on and the transistor Tr22 is turned off. Therefore, the node N12 has an H level and the output signal X has an L level.

When the input signals A1, A2 and A3 are "0, 1, 0", the node N11 has an H level. The transistor Tr24 is turned on and the transistor Tr26 is turned off. Further, the transistor Tr23 is turned on and the transistor Tr25 is turned off. The transistor Tr21 is turned on and the transistor Tr22 is turned off. The node N12 therefore has an H level and the output signal X has an L level.

When the input signals A1, A2 and A3 are "1, 1, 0", the node N11 has an L level. The transistor Tr24 is turned off and the transistor Tr26 is turned on. Further, the transistor Tr23 is turned on and the transistor Tr25 is turned off. The transistor Tr21 is turned on and the transistor Tr22 is turned off. Thus, the node N12 has an H level and the output signal X has an L level.

When the input signals A1, A2 and A3 are "0, 0, 1", the node N11 has an H level. The transistor Tr24 is turned on and the transistor Tr26 is turned off. Further, the transistor Tr23 is turned off and the transistor Tr25 is turned on. The transistor Tr21 is turned off and the transistor Tr22 is turned on. Therefore, the node N12 has an H level and the output signal X has an L level.

When the input signals A1, A2 and A3 are "1, 0, 1", the node N11 has an L level. The transistor Tr24 is turned off and the transistor Tr26 is turned on. Further, the transistor Tr23 is turned off and the transistor Tr25 is turned on. The transistor Tr21 is turned off and the transistor Tr22 is turned on. Therefore, the node N12 has an H level and the output signal X has an L level.

When the input signals A1, A2 and A3 are "0, 1, 1", the node N11 has an H level. The transistor Tr24 is turned on and the transistor Tr26 is turned off. Further, the transistor Tr23 is turned on and the transistor Tr25 is turned off. The transistor Tr21 is turned off and the transistor Tr22 is turned on. Therefore, the node N12 has an L level and an output signal X has an H Level.

When the input signals A1, A2 and A3 all are "1", the node N11 has an L level. The transistor Tr24 is turned off and the transistor Tr26 is turned on. Further, the transistor Tr23 is turned on and the transistor Tr25 is turned off. The transistor Tr21 is turned off and the transistor Tr22 is turned on. Therefore, the node N12 has an H level and the output signal X has an L level.

This AND gate 8 requires a total of ten transistors, eight transistors for outputting an AND logic and two transistors of the inverter 1s for inverting the input signal A1.

Nighth Prior Art

FIG. 20 shows a 3-input NOR gate 9 with a CMOS structure. An input signal A1 is input to the gates of a PMOS transistor Tr27 and an NMOS transistor Tr32.

An input signal A2 is input to a CMOS inverter 1v. The CMOS inverter 1v emits a signal from a node N13 to the gates of a PMOS transistor Tr29 and an NMOS transistor Tr30. An input signal A3 is input to a CMOS inverter 1u. The CMOS inverter 1u emits a signal from a node N14 to the gates of a PMOS transistor Tr28 and an NMOS transistor Tr31.

The transistor Tr27 has a source connected to a high potential power supply $V_{CC}$ and a drain connected to the source of the transistor Tr28. The drain of the transistor Tr28 is connected to the source of the transistor Tr29 a drain of which is connected to the drain of the transistor Tr30. The source of the transistor Tr30 is connected to the low-potential power supply $V_{SS}$.

The transistor Tr31 has a drain connected to the drains of the transistors Tr29 and Tr30, and a source connected to the low-potential power supply $V_{SS}$. The transistor Tr32 has a drain connected to the drains of the transistors Tr29 and Tr30 and a source connected to the low-potential power supply $V_{SS}$.

The NOR gate 9 performs an operation based on truth values shown in FIG. 19 as per the seventh prior art and is represented by a symbol shown in FIG. 21. That is, the NOR gate 9 generates an NOR logic signal, from the inverted signals of the input signals A2 and A3 and the input signal A1, as an output signal X.

When the input signals A1, A2 and A3 all are "0", the nodes N13 and N14 have H levels. The transistor Tr27 is turned on and the transistor Tr32 is turned off. The transistor Tr30 is turned on and the transistor Tr29 is turned off. The transistor Tr28 is turned off and the transistor Tr31 is turned on. Therefore, the output signal X has an L level.

When the input signals A1, A2 and A3 are "1, 0, 0", the nodes N13 and N14 have H levels. The transistor Tr27 is turned off and the transistor Tr32 is turned on. The transistor Tr30 is turned on and the transistor Tr29 is turned off. The transistor Tr28 is turned off and the transistor Tr31 is turned on. Thus, the output signal X has an L level.

When the input signals A1, A2 and A3 are "0, 1, 0", the node N13 has an L level and the node N14 has an H level. The transistor Tr27 is turned on and the transistor Tr32 is turned off. The transistor Tr30 is turned off and the transistor Tr29 is turned on. The transistor Tr28 is turned off and the transistor Tr31 is turned on. The output signal X therefore has an L level.

When the input signals A1, A2 and A3 are "1, 1, 0", the node N13 has an L level and the node N14 has an H level. The transistor Tr27 is turned off and the transistor Tr32 is turned on. The transistor Tr30 is turned off and the transistor Tr29 is turned on. The transistor Tr28 is turned off and the transistor Tr31 is turned on. The output signal X thus has an L level.

When the input signals A1, A2 and A3 are "0, 0, 1", the node N13 has an H level and the node N14 has an L level. The transistor Tr27 is turned on and the transistor Tr32 is turned off. The transistor Tr30 is turned on and the transistor Tr29 is turned off. The transistor Tr28 is turned on and the transistor Tr31 is turned off. Thus, the output signal X has an L level.

When the input signals A1, A2 and A3 are "1, 0, 1", the node N13 has an H level and the node N14 has an L level. The transistor Tr27 is turned off and the transistor Tr32 is turned on. The transistor Tr30 is turned on and the transistor Tr29 is turned off. The transistor Tr28 is turned on and the transistor Tr31 is turned off. Therefore, the output signal X has an L level.

When the input signals A1, A2 and A3 are "0, 1, 1", the nodes N13 and N14 have L levels. The transistor Tr27 is turned on and the transistor Tr32 is turned off. The transistor Tr30 is turned off and the transistor Tr29 is turned on. The transistor Tr28 is turned on and the transistor Tr31 is turned off. Therefore, the output signal X has an H level.

When the input signals A1, A2 and A3 all are "1", the nodes N13 and N14 have L levels. The transistor Tr27 is turned off and the transistor Tr32 is turned on. The transistor Tr30 is turned off and the transistor Tr29 is turned on. The transistor Tr28 is turned on and the transistor Tr31 is turned off. Thus, the output signal X has an L level.

The NOR gate 9 requires a total of ten transistors, six transistors for outputting a NOR logic and four transistors of the inverters 1v and 1u for inverting the input signals A2 and A3.

Ninth Prior Art

FIG. 22 shows a 3-input OR gate 10 with a CMOS structure. An input signal A1 is input to an inverter 1w. The inverter 1w emits a signal from a node N15 to the gates of a PMOS transistor Tr35 and an NMOS transistor Tr36.

An input signal A2 is input to the gates of a PMOS transistor Tr34 and an NMOS transistor Tr37. An input signal A3 is input to the gates of a PMOS transistor Tr33 and an NMOS transistor Tr38.

The transistor Tr33 has a source connected to a high potential power supply $V_{CC}$ and a drain connected to the source of the transistor Tr34. The transistor Tr34 has a drain connected to the source of the transistor Tr35 a drain of which is connected to the drain of the transistor Tr36 or the node N16. The source of the transistor Tr36 is connected to a low-potential power supply $V_{SS}$.

The transistors Tr37 and 38 have drains connected to the node N16 and sources connected to the low-potential power supply $V_{SS}$. The node N16 is connected to a CMOS inverter 1x which outputs the output signal X.

The OR gate 10 performs an operation based on truth values shown in FIG. 24 and is represented by a symbol shown in FIG. 23. That is, the OR gate 10 generates an OR logic signal, from the inverted signal of the input signal A1 and the input signals A2 and A3, as an output signal X.

When the input signals A1, A2 and A3 all are "10", the node N15 has an H level. The transistor Tr36 is turned on and the transistor Tr35 is turned off. The transistor Tr34 is turned on and the transistor Tr37 is turned off. The transistor Tr33 is turned on and the transistor Tr38 is turned off. Therefore, the node N16 has an L level and an output signal X has an H Level.

When the input signals A1, A2 and A3 are "1, 0, 0", the node N15 has an L level. The transistor Tr36 is turned off and the transistor Tr35 is turned on. The transistor Tr34 is turned on and the transistor Tr37 is turned off. The transistor Tr33 is turned on and the transistor Tr38 is turned off. Therefore, the node N16 has an H level and the output signal X has an L level.

When the input signals A1, A2 and A3 are "0, 1, 0", the node N15 has an H level. The transistor Tr36 is turned on and the transistor Tr35 is turned off. The transistor Tr34 is turned off and the transistor Tr37 is turned on. The transistor Tr33 is turned on and the transistor Tr38 is turned off. Therefore, the node N16 has an L level and the output signal X has an H level.

When the input signals A1, A2 and A3 are "1, 1, 0", the node N15 has an L level. The transistor Tr36 is turned off and the transistor Tr35 is turned on. The transistor Tr34 is turned off and the transistor Tr37 is turned on. The transistor Tr33 is turned on and the transistor Tr38 is turned off. Therefore, the node N16 has an L level and the output signal X has an H level.

When the input signals A1, A2 and A3 are "0, 0, 1", the node N15 has an H level. The transistor Tr36 is turned on and the transistor Tr35 is turned off. The transistor Tr34 is turned on and the transistor Tr37 is turned off. The transistor Tr33 is turned off and the transistor Tr38 is turned on. Therefore, the node N16 has an L level and the output signal X has an H level.

When the input signals A1, A2 and A3 are "1, 0, 1", the node N15 has an L level. The transistor Tr36 is turned off and the transistor Tr35 is turned on. The transistor Tr34 is turned on and the transistor Tr37 is turned off. The transistor Tr33 is turned off and the transistor Tr38 is turned on. Therefore, the node N16 has an L level and the output signal X has an H level.

When the input signals A1, A2 and A3 are "0, 1, 1", the node N15 has an H level. The transistor Tr36 is turned on and the transistor Tr35 is turned off. The transistor Tr34 is turned off and the transistor Tr37 is turned on. The transistor Tr33 is turned off and the transistor Tr38 is turned on.

Therefore, the node N16 has an L level and the output signal X has an H level.

When the input signals A1, A2 and A3 all are "1", the node N15 has an L level. The transistor Tr36 is turned off and the transistor Tr35 is turned on. The transistor Tr34 is turned off and the transistor Tr37 is turned on. The transistor Tr33 is turned off and the transistor Tr38 is turned on. Therefore, the node N16 has an L level and the output signal X has an H level.

The OR gate 10 requires a total of ten transistors, eight transistors for outputting an OR logic and two transistors of the inverter 1w for inverting the input signal A1.

Tenth Prior Art

FIG. 25 shows a 3-input NAND gate 11 with a CMOS structure. An input signal A1 is input to the gates of a PMOS transistor Tr39 and an NMOS transistor Tr40.

An input signal A2 is input to a CMOS inverter 1y. The CMOS inverter 1y emits a signal from a node N17 to the gates of an NMOS transistor Tr41 and a PMOS transistor Tr43. An input signal A3 is input to a CMOS inverter 1z. The CMOS inverter 1z emits a signal from a node N18 to the gates of an NMOS transistor Tr42 and a PMOS transistor Tr44.

The transistor Tr39 has a source connected to a high potential power supply $V_{CC}$ and a drain connected to the drain of the transistor Tr40. The source of the transistor Tr40 is connected to the drain of the transistor Tr41 a source of which is connected to the drain of the transistor Tr42. The source of the transistor Tr42 is connected to the low-potential power supply $V_{SS}$.

The transistors Tr43 and Tr44 have sources connected to the high potential power supply $V_{CC}$ and drains connected to the drains of the transistors Tr39 and Tr40. The output signal X is output from the drains of the transistors Tr39, Tr40, Tr43 and Tr44.

The NAND gate 11 performs an operation based on truth values shown in FIG. 24 as per the ninth prior art and is represented by a symbol shown in FIG. 26. That is, the NAND gate 11 generates an NAND logic signal, from the input signal A1 and the inverted signals of the input signals A2 and A3, as an output signal X.

When the input signals A1, A2 and A3 all are "1, 0, 0", the nodes N17 and N18 have H levels. The transistor Tr39 is turned on and the transistor Tr40 is turned off. The transistor Tr41 is turned on and the transistor Tr43 is turned off. The transistor Tr42 is turned on and the transistor Tr44 is turned off. Therefore, an output signal X has an H Level.

When the input signals A1, A2 and A3 are "1, 0, 0", the nodes N17 and N18 have H levels. The transistor Tr39 is turned off and the transistor Tr40 is turned on. The transistor Tr41 is turned on and the transistor Tr43 is turned off. The transistor Tr42 is turned on and the transistor Tr44 is turned off. Therefore, the output signal X has an L level.

When the input signals A1, A2 and A3 are "0, 1, 0", the node N17 has an L level and the node N18 has an H level. The transistor Tr39 is turned on and the transistor Tr40 is turned off. The transistor Tr41 is turned off and the transistor Tr43 is turned on. The transistor Tr42 is turned on and the transistor Tr44 is turned off. Thus, the output signal X has an H level.

When the input signals A1, A2 and A3 are "1, 1, 0", the node N17 has an L level and the node N18 has an H level. The transistor Tr39 is turned off and the transistor Tr40 is turned on. The transistor Tr41 is turned off and the transistor Tr43 is turned on. The transistor Tr42 is turned on and the transistor Tr44 is turned off. The output signal X therefore has an H level.

When the input signals A1, A2 and A3 are "0, 0, 1", the node N17 has an H level and the node N18 has an L level. The transistor Tr39 is turned on and the transistor Tr40 is turned off. The transistor Tr41 is turned on and the transistor Tr43 is turned off. The transistor Tr42 is turned off and the transistor Tr44 is turned on. Thus, the output signal X has an H level.

When the input signals A1, A2 and A3 are "1, 0, 1", the node N17 has an H level and the node N18 has an L level. The transistor Tr39 is turned off and the transistor Tr40 is turned on. The transistor Tr41 is turned on and the transistor Tr43 is turned off. The transistor Tr42 is turned off and the transistor Tr44 is turned on. Thus, the output signal X has an H level.

When the input signals A1, A2 and A3 are "0, 1, 1", the nodes N17 and N18 have L levels. The transistor Tr39 is turned on and the transistor Tr40 is turned off. The transistor Tr41 is turned off and the transistor Tr43 is turned on. The transistor Tr42 is turned off and the transistor Tr44 is turned on. Therefore, the output signal X has an H level.

When the input signals A1, A2 and A3 all are "1", the nodes N17 and N18 have L levels. The transistor Tr39 is turned off and the transistor Tr40 is turned on. The transistor Tr41 is turned off and the transistor Tr43 is turned on. The transistor Tr42 is turned off and the transistor Tr44 is turned on. The output signal X therefore has an H level.

The NAND gate 11 requires a total of ten transistors, six transistors for outputting a NAND logic and four transistors of the inverters 1y and 1z for inverting the input signals A2 and A3.

The above-discussed prior arts require six transistors for a 2-input type and ten transistors for a 3-input type. In general, provided that the number of inputs is given by n, 4n−2 transistors are needed. Each conventional logic circuit therefore requires many elements, which increases the chip area of any semiconductor integrated circuit device that uses a lot of such logic circuits.

Further, each prior art has at least one inverter so that when the inverter inverts its input signal, a through current flows from the high potential power supply $V_{CC}$ to the low-potential power supply $V_{SS}$. Therefore, the power consumption of any semiconductor integrated circuit device which uses a lot of such logic circuits is increased in prior arts.

SUMMARY OF THE INVENTION

Accordingly, it is an objective of the present invention to provide a CMOS logic circuit with reduced the circuit area.

It is another objective to provide a CMOS logic circuit power consumption of which is lowered. The present invention can be implemented in numerous ways, including as an apparatus and method.

One aspect of the invention pertains to a logic circuit for receiving a plurality of input signals each having a high or low level and for outputting a high or low output signal. The logic circuit includes a plurality of MOS transistors including a first MOS transistor and a second MOS transistor. Each MOS transistor has one of a first conductivity and a second conductivity. The first MOS transistor is connected to one of the plurality of input signals. The second MOS transistor is connected to a power supply. The plurality of MOS transistors operate to produce the output signal in response to the another at least one input signal of the plurality of input signals. The output signal has either substantially the same level as the one input signal or the level of the power supply.

Another aspect of the invention pertains to a logic circuit for receiving a plurality of input signals each having a high or low level and outputting a high or low output signal. The logic circuit includes a plurality of MOS transistors including a first MOS transistor and a second MOS transistor. Each MOS transistor has one of a first conductivity and a second conductivity. The first MOS transistor is connected to one of the plurality of input signals. The second MOS transistor is connected to a power supply. The plurality of MOS transistors are responsive to an another at least one input signal of the plurality of input signals. The plurality of MOS transistors are set to 2n−2 where n is the number of the plurality of input signals so that the plurality of MOS transistors operate to produce the output signal in response to the another at least one input signal.

Yet another aspect of the invention pertains to a logic circuit for receiving a plurality of input signals each having a high or low level and outputting a high or low output signal. The logic circuit includes a plurality of MOS transistors including a first MOS transistor and a second MOS transistor. Each MOS transistor has one of a first conductivity and a second conductivity. The first MOS transistor is connected to one of the plurality of input signals. The second MOS transistor is connected to a power supply. The plurality of MOS transistors are responsive to an another at least one input signal of the plurality of input signals. The plurality of MOS transistors operate to produce the output signal in response to the another at least one input signal without using the construction of a CMOS inverter.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1 is a diagram of a CMOS logic circuit according to a first prior art example;

FIG. 2 is a diagram showing a symbol of the first prior art example;

FIG. 3 is an explanatory diagram showing truth values of the first prior art example;

FIG. 4 is a diagram of a CMOS logic circuit according to a second prior art example;

FIG. 5 is a diagram showing a symbol of the second prior art example;

FIG. 6 is an explanatory diagram showing truth values of the second prior art example;

DETAILED DESCRIPTION OF THE PREFERRED EMBODIMENTS

Figure 27:
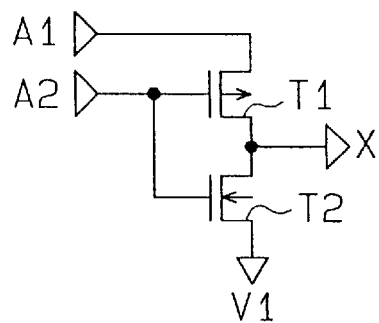
FIG. 27 is a principle diagram of a CMOS logic circuit according to the invention.

FIG. 27 is a principle diagram of a CMOS logic circuit embodying this invention. A P channel MOS (PMOS) transistor T1 and an N channel MOS (NMOS) transistor T2 constitute a logic circuit. The logic circuit outputs an output signal X of a predetermined logic when a plurality of input signals A1 and A2 are input to the transistors T1 and T2. One input signal A1 is input to the source or drain of one MOS transistor and the other input signal A2 is input to the gates of the MOS transistors T1 and T2. The logic circuit outputs the output signal X of a desired logic having either the level of the input signal A1 or the level of one power supply V1 based on the input signals A1 and A2.

First Embodiment

Figure 28:
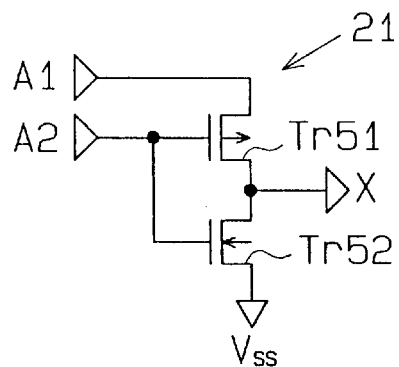
FIG. 28 is a diagram of a CMOS logic circuit according to a first embodiment of the invention.

FIG. 28 illustrates a CMOS logic circuit 21 according to a first embodiment of the invention, which operates as a 2-input NOR gate.

The input signal A1 is input to the source (drain) of a PMOS transistor Tr51, and the input signal A2 is input to the gates of the transistor Tr51 and an NMOS transistor Tr52. The transistor Tr52 has a source connected to a low power supply $V_{SS}$ and a drain connected to the drain (source) of the transistor Tr51. The output signal X is output from the drain of the transistor Tr52 and the drain (source) of the transistor Tr51.

The 2-input NOR gate 21 operates based on truth values shown in FIG. 3 and is represented by the symbol shown in FIG. 2. That is, the 2-input NOR gate 21 generates an NOR logic signal, from the inverted signal of the input signal A1 and the input signal A2, as an output signal X.

When the input signals A1 and A2 both are "0", the transistor Tr51 is turned on and the transistor Tr52 is turned off. Therefore, the input signal A1, which has an L level, is output as the output signal X via the transistor Tr51.

When the input signal A1 is "1" and the input signal A2 is "1", the transistor Tr51 is turned off and the transistor Tr52 is turned on. Therefore, the output signal X has an L level (the potential of the low-potential power supply Vss).

When the input signal A1 is "1" and the input signal A2 is "0", the transistor Tr51 is turned on and the transistor Tr52 is turned off. Therefore, the input signal A1, which has an H level, is output as the output signal X via the transistor Tr51.

When the input signals A1 and A2 both are "1", the transistor Tr51 is turned off and the transistor Tr52 is turned on. Thus, the output signal X has an L level (the potential of the low-potential power supply Vss).

In this 2-input NOR gate 21, the following advantages are obtained.

(A) Since the 2-input NOR gate 21 is constituted of two MOS transistors, the number of required elements is reduced as compared with the first prior art example. The circuit area is reduced accordingly.

(B) As no inverter is required, no through current flows from the high potential power supply $V_{CC}$ to the low-potential power supply $V_{SS}$. The power consumption is thus reduced.

(C) The chip area of any semiconductor integrated circuit device that uses many such 2-input NOR gates 21 can thus be reduced.

(D) It is possible to reduce the power consumption of any semiconductor integrated circuit device that uses such 2-input NOR gates 21.

Second Embodiment

Figure 29:
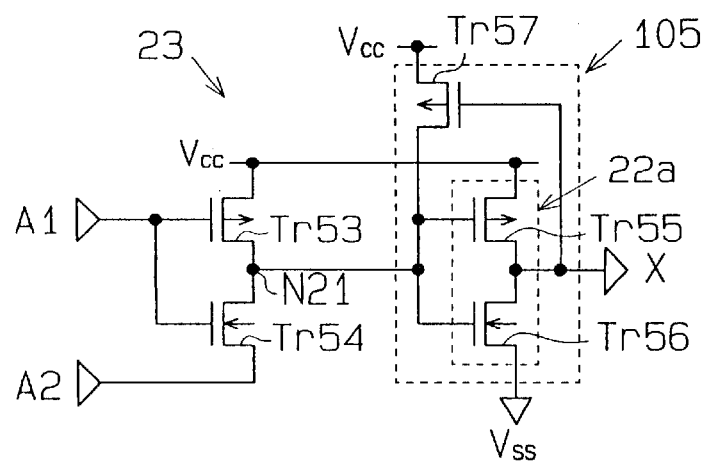
FIG. 29 is a diagram of a CMOS logic circuit according to a second embodiment of the invention.

FIG. 29 illustrates a CMOS logic circuit 23 according to a second embodiment of the invention, which operates as a 2-input NOR gate.

The NOR gate 23 of the second embodiment is configured to ensure that the output signal X fully fluctuates between the level of the high potential power supply $V_{CC}$ and the level of the low-potential power supply $V_{SS}$.

The 2-input NOR gate 21 of the first embodiment outputs the output signal X, which has a level higher than the L level of input signal A1 by the threshold value of the transistor Tr51 when the transistor Tr51 is turned on and the input signal A1 is "0". Even when an input signal A1, which has the potential level of the low-potential power supply $V_{SS}$, is input, therefore, the output signal X does not fully reach the low potential of the power supply $V_{SS}$. In the embodiment of FIG. 29, the input signal A2 is input to the source (drain) of an NMOS transistor Tr54. The input signal A1 is input to the gates of the transistor Tr54 and a PMOS transistor Tr53. The transistor Tr53 has a source connected to a high potential power supply $V_{CC}$ and a drain connected to the drain (source) of the transistor Tr54, forming a node N21.

The node N21 is connected to an inverter 22a, which outputs the output signal X. The output signal X is input to the gate of a PMOS transistor Tr57. The transistor Tr57 has a source connected to the high potential power supply $V_{CC}$ and a drain connected to the node N21. The transistor Tr57 and the inverter 22a constitute an output stabilizing circuit 105.

The 2-input NOR gate 23 operates based on the truth values shown in FIG. 3 and is represented by the symbol shown in FIG. 2. That is, the NOR gate 23 generates an NOR logic signal, from the inverted signal of the input signal A1 and the input signal A2, as an output signal X.

When the input signals A1 and A2 both are "0", the transistor Tr53 is turned on and the transistor Tr54 is turned off, causing the node N21 to have an H level. Therefore, the output signal X has an L level.

When the input signal A1 is "0" and the input signal A2 is "1", the transistor Tr53 is turned on and the transistor Tr54 is turned off, setting the node N21 to the H level. Thus, the output signal X has an L level.

When the input signal A1 is "1" and the input signal A2 is "0", the transistor Tr53 is turned off and the transistor Tr54 is turned on, causing the node N21 to have an L level. An output signal X therefore has an H level.

When the input signals A1 and A2 both are "1", the transistor Tr53 is turned off and the transistor Tr54 is turned on, causing the node N21 to have an H level. The output signal X thus has an L level.

At this time, the node N21 has a potential level lower than that of the input signal A1 by the threshold value of the transistor Tr54. However, the potential at the node N21 is pulled up to the level of the high potential power supply $V_{CC}$ by the ON action of the transistor Tr57. The transistor Tr57 is turned on if the potential difference between the output signal X of the inverter 22a and the high potential power supply $V_{CC}$ becomes equal to or greater than the threshold value of the transistor Tr57. The output signal X is thus positively pulled down to the level of the low-potential power supply $V_{SS}$. Therefore, it is possible to ensure that the output signal X fully fluctuates between the level of the high potential power supply $V_{CC}$ and the level of the low-potential power supply $V_{SS}$.

This 2-input NOR gate 23 has the following advantages.

(A) Since the 2-input NOR gate 23 is constituted of five MOS transistors, the number of required elements is reduced as compared with the first prior art example. The circuit area is reduced accordingly.

(B) It is possible to reduce the chip area of any semiconductor integrated circuit device that uses many such 2-input NOR gates 23.

(C) The operation of the output signal stabilizing circuit 105 permits the output signal X to fully fluctuate between the levels of the high-potential power supply $V_{CC}$ and the low-potential power supply $V_{SS}$ even if the amplitudes of the input signals A1 and A2 become smaller.

Third Embodiment

Figure 30:
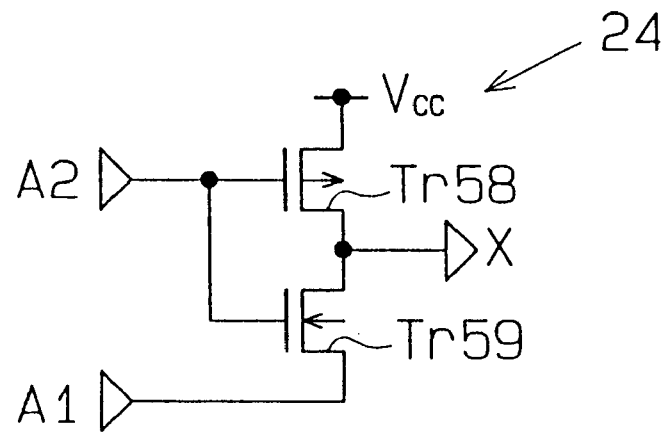
FIG. 30 is a diagram of a CMOS logic circuit according to a third embodiment of the invention.

FIG. 30 illustrates a CMOS logic circuit 24 according to a third embodiment of the invention, which operates as a 2-input NAND gate.

The input signal A1 is input to the source (drain) of an NMOS transistor Tr59, and the input signal A2 is input to the gates of the transistor Tr59 and a PMOS transistor Tr58.

The transistor Tr58 has a source connected to a high potential power supply $V_{CC}$ and a drain connected to the drain (source) of the transistor Tr59. The output signal X is output from the drain of the transistor Tr58 and the drain (source) of the transistor Tr59.

The 2-input NAND gate 24 operates based on the truth values shown in FIG. 6 and is represented by the symbol shown in FIG. 5. That is, NAND gate 24 generates an NAND logic signal, from the inverted signal of the input signal A1 and the input signal A2, as an output signal X.

When the input signals A1 and A2 both are "0", the transistor Tr58 is turned on and the transistor Tr59 is turned off. Therefore, an output signal X has an H Level.

When the input signal A1 is "0" and the input signal A2 is "1", the transistor Tr58 is turned off and the transistor Tr59 is turned on. Therefore, the input signal A1, which has an L level, is output as the output signal X via the transistor Tr59.

When the input signal A1 is "1" and the input signal A2 is "0", the transistor Tr58 is turned on and the transistor Tr59 is turned off. Therefore, an output signal X has an H level (the potential level of the high potential power supply $V_{CC}$).

When the input signals A1 and A2 both are "1", the transistor Tr58 is turned off and the transistor Tr59 is turned on. Consequently, the input signal A1, which has an H level, is output as the output signal X via the transistor Tr59. At this time, the output signal X has a level lower than that of the input signal A2 by the threshold value of the transistor Tr59, even if the input signal A1 and A2 have the level of high potential power supply $V_{CC}$.

This 2-input NAND gate 24 has the following advantages.

(A) Since the 2-input NAND gate 24 is constituted of two MOS transistors, the number of required elements is reduced as compared with the second prior art example. The circuit area is reduced accordingly.

(B) Since no inverter is required, no through current flows from the high potential power supply $V_{CC}$ to the low-potential power supply $V_{SS}$.

(C) It is possible to reduce the chip area of any semiconductor integrated circuit device that uses many such 2-input NAND gates 24.

(D) It is possible to reduce the power consumption of any semiconductor integrated circuit device that uses such 2-input NAND gates 24.

Fourth Embodiment

Figure 31:
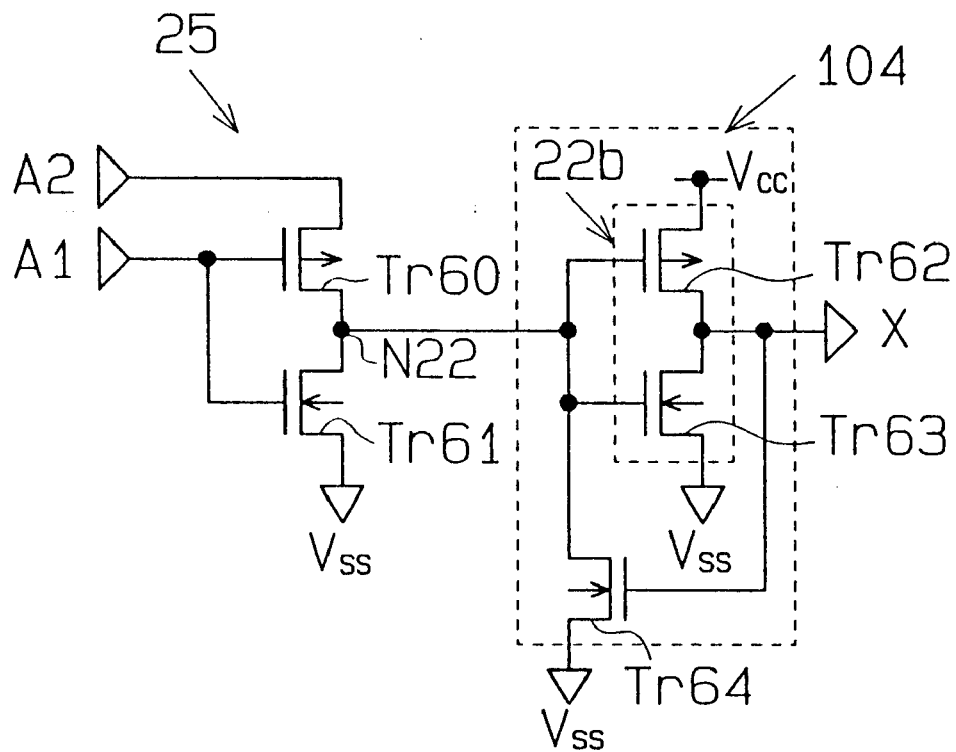
FIG. 31 is a diagram of a CMOS logic circuit according to a fourth embodiment of the invention.

FIG. 31 illustrates a CMOS logic circuit 25 according to a fourth embodiment of the invention, which operates as a 2-input NAND gate.

The 2-input NAND gate 25 of the fourth embodiment is configured to ensure that the output signal X fully fluctuates between the level of the high potential power supply $V_{CC}$ and the level of the low-potential power supply $V_{SS}$.

The 2-input NAND gate 24 of the third embodiment outputs the output signal X which has a level lower than that of the input signal A1 by the threshold value of the transistor Tr59 when the transistor Tr59 is turned on and the input signal A1 is "1". Therefore, the output signal X does not fully reach the high potential of the high potential power supply $V_{CC}$ even when the potential level of the high potential power supply $V_{CC}$ is input as the H-level input signals A1 and A2.

In the embodiment of FIG. 31, the input signal A1 is input to the gates of a PMOS transistor Tr60 and an NMOS transistor Tr61. The input signal A2 is input to the source (drain) of the transistor Tr60. The drain (source) of the transistor Tr60 is connected to the drain of the transistor Tr61, forming a node N22. The source of the transistor Tr61 is connected to the low-potential power supply $V_{SS}$.

The node N22 is connected to an inverter 22b which outputs the output signal X. The output signal X is input to the gate of an NMOS transistor Tr64. The transistor Tr64 has a drain connected to the node N22 and a source connected to the low-potential power supply $V_{SS}$. The inverter 22b and the transistor Tr64 form an output signal stabilizing circuit 104.

The 2-input NAND gate 25 operates based on the truth values shown in FIG. 6 and is represented by the symbol shown in FIG. 5. That is, the 2-input NAND gate 25 generates an NAND logic signal, from the inverted signal of the input signal A1 and the input signal A2, as an output signal X.

When the input signals A1 and A2 both are "0", the transistor Tr60 is turned on and the transistor Tr61 is turned off. Consequently, the input signal A2 is sent to the node N22 via the transistor Tr60, causing the node N22 to have an L level. Therefore, an output signal X has an H Level. At this time, the node N22 has a level higher than that of the input signal A2 by the threshold value of the transistor Tr60. However, the potential at the node N22 is pulled down to the level of the low-potential power supply $V_{SS}$ by the ON action of the transistor Tr64. The transistor Tr64 is turned on if the potential difference between the output signal X of the inverter 22b and the low-potential power supply $V_{SS}$ becomes equal to or greater than the threshold value of the transistor Tr64. Therefore, the output signal X is positively pulled up to the level of the high potential power supply $V_{CC}$.

When the input signal A1 is "0" and the input signal A2 is "1", the transistor Tr60 is turned on and the transistor Tr61 is turned off. Consequently, the input signal A2 is sent to the node N22 via the transistor Tr60, causing the node N22 to have the H level. Thus, the output signal X has an L level.

When the input signal A1 is "1" and the input signal A2 is "0", the transistor Tr60 is turned off and the transistor Tr61 is turned on, causing the node N22 to have an L level. The output signal X therefore has an H level.

When the input signals A1 and A2 both are "1", the transistor Tr60 is turned off and the transistor Tr61 is turned on, setting the node N22 to the L level. Thus, the output signal X has an H level.

The 2-input NAND gate 25 has the following advantages.

(A) Since the 2-input NAND gate 25 is constituted of five MOS transistors, the number of required elements is reduced as compared with the second prior art example. The circuit area is reduced accordingly.

(B) It is possible to reduce the chip area of any semiconductor integrated circuit device that uses many such 2-input NAND gates 25.

(C) The output signal stabilizing circuit 104 permits the output signal X to fully fluctuate between the levels of the high-potential high potential power supply $V_{CC}$ and the low-potential power supply $V_{SS}$ even if the amplitudes of the input signals A1 and A2 become smaller.

Fifth Embodiment

Figure 32:
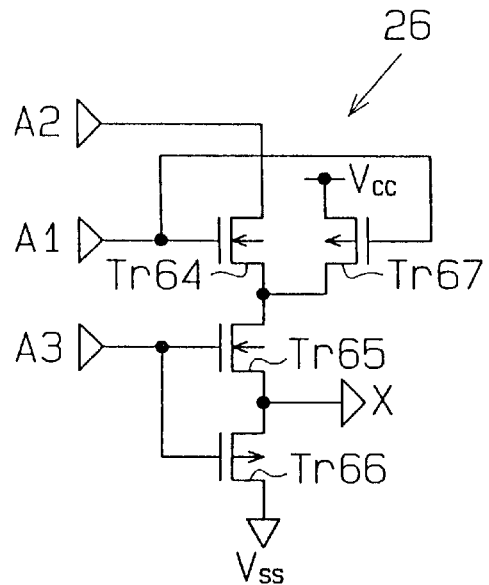
FIG. 32 is a diagram of a CMOS logic circuit according to a fifth embodiment of the invention.

FIG. 32 illustrates a CMOS logic circuit 26 according to a fifth embodiment of the invention, which operates as a 2-wide, 2-AND, 3-input AND-OR-INVERT gate.

An input signal A1 is input to the gates of an NMOS transistor Tr64 and a PMOS transistor Tr67, and an input signal A2 is input to the drain (source) of the transistor Tr64. An input signal A3 is input to the gates of an NMOS transistor Tr65 and a PMOS transistor Tr66. The transistor Tr65 has a drain (source) connected to the source (drain) of the transistor Tr64, and a source (drain) connected to the source of the transistor Tr66. The drain of the transistor Tr66 is connected to a low-potential power supply $V_{SS}$. The output signal X is output from the source of the transistor Tr66. The transistor Tr67 has a source connected to a high potential power supply $V_{CC}$ and a drain connected to the drain (source) of the transistor Tr65.

Figure 7:
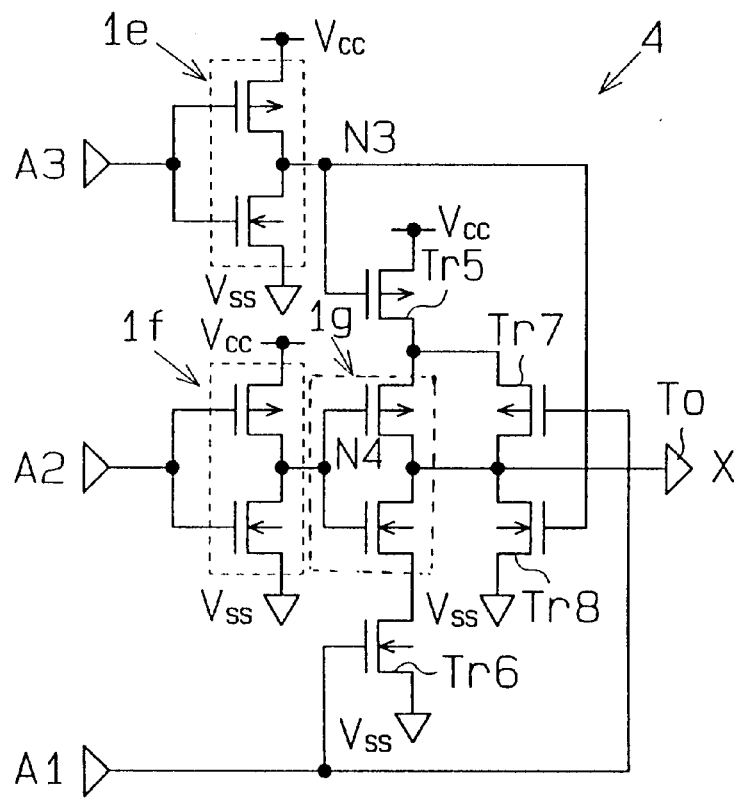
FIG. 7 is a diagram of a CMOS logic circuit according to a third prior art example.
Figure 8:
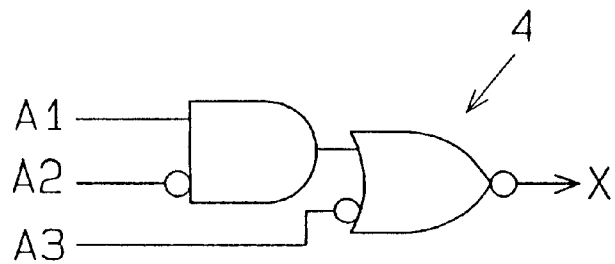
FIG. 8 is a diagram showing a symbol of the third prior art example.
Figures 9, 10:
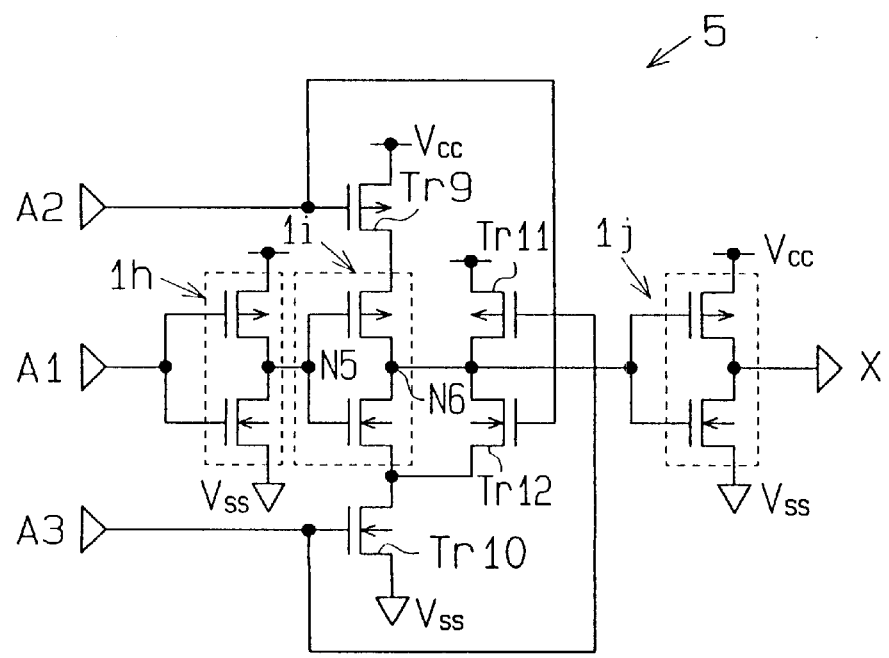
FIG. 9 is an explanatory diagram showing truth values of the third prior art example.
FIG. 10 is a diagram of a CMOS logic circuit according to a fourth prior art example.
Figure 11:
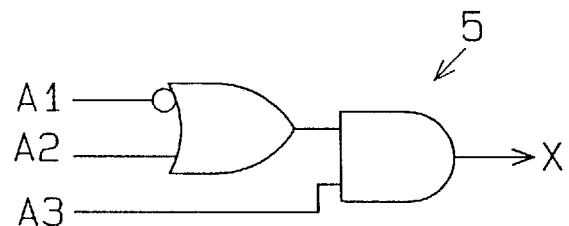
FIG. 11 is a diagram showing a symbol of the fourth prior art example.
Figure 12:
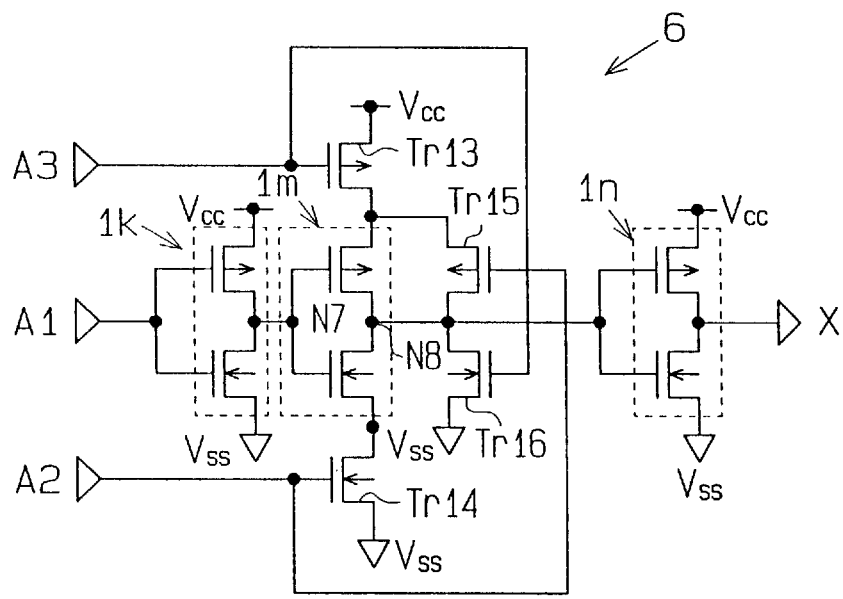
FIG. 12 is a diagram of a CMOS logic circuit according to a fifth prior art example.

The AND-OR-INVERT gate 26 performs an operation based on the truth values shown in FIG. 9 and is represented by the symbol shown in FIG. 8. That is, the AND-OR-INVERT gate 26 generates an AND logic signal from the input signal A1 and the inverted signal of the input signal A2. The AND-OR-INVERT gate 26 further generates an NOR logic signal, from the AND logic signal and the inverted signal of the input signal A3, as an output signal X.

When the input signals A1, A2 and A3 all are "0", the transistors Tr64 and Tr65 are turned off and the transistors Tr66 and Tr67 are turned on. Therefore, the output signal X has an L level.

When the input signals A1, A2 and A3 are "1, 0, 0", the transistors Tr64 and Tr66 are turned on and the transistors Tr65 and Tr67 are turned off. Thus, the output signal X has an L level.

When the input signals A1, A2 and A3 are "0, 1, 0", the transistors Tr64 and Tr65 are turned off and the transistors Tr66 and Tr67 are turned on. The output signal X therefore has the L level.

When the input signals A1, A2 and A3 are "1, 1, 0", the transistors Tr64 and Tr66 are turned on and the transistors Tr65 and Tr67 are turned off. Consequently, the output signal X has an L level.

When the input signals A1, A2 and A3 are "0, 0, 1", the transistors Tr64 and Tr66 are turned off and the transistors Tr65 and Tr67 are turned on. Thus, an output signal X has an H Level. At this time, the level of the output signal X is lower than the level of the input signal A3 by the threshold value of the transistor Tr65.

When the input signals A1, A2 and A3 are "1, 0, 1", the transistors Tr64 and Tr65 are turned on and the transistors Tr66 and Tr67 are turned off. As a result, the L-level input signal A2 is output as the output signal X via the transistors Tr64 and Tr65, so that the output signal X has an L level.

When the input signals A1, A2 and A3 are "0, 1, 1", the transistors Tr64 and Tr66 are turned off and the transistors Tr65 and Tr67 are turned on. Thus, the output signal X has an H level. At this time, the level of the output signal X is lower than the level of the input signal A3 by the threshold value of the transistor Tr65.

When the input signals A1, A2 and A3 are "1, 1, 1", the transistors Tr64 and Tr65 are turned on and the transistors Tr66 and Tr67 are turned off. Consequently, the H-level input signal A2 is output as the output signal X via the transistors Tr64 and Tr65, so that the output signal X has an H level. At this time, the level of the output signal X is lower than the level of the input signal A2 by the threshold values of the transistors Tr64 and Tr65.

The AND-OR-INVERT gate 26 has the following advantages.

(A) Since the 2-wide, 2-AND, 3-input AND-OR-INVERT gate 26 is constituted of four MOS transistors, the number of required elements is reduced as compared with the third prior art example. The circuit area is reduced accordingly.

(B) Since no inverter is required, no through current flows from the high potential power supply $V_{CC}$ to the low-potential power supply $V_{SS}$. It is thus possible to reduce the power consumption.

(C) It is possible to reduce the chip area of any semiconductor integrated circuit device that uses many such 2-wide, 2-AND, 3-input AND-OR-INVERT gates 26.

(D) It is possible to reduce the power consumption of any semiconductor integrated circuit device which uses such 2-wide, 2-AND, 3-input AND-OR-INVERT gates 26.

Sixth Embodiment

Figure 33:
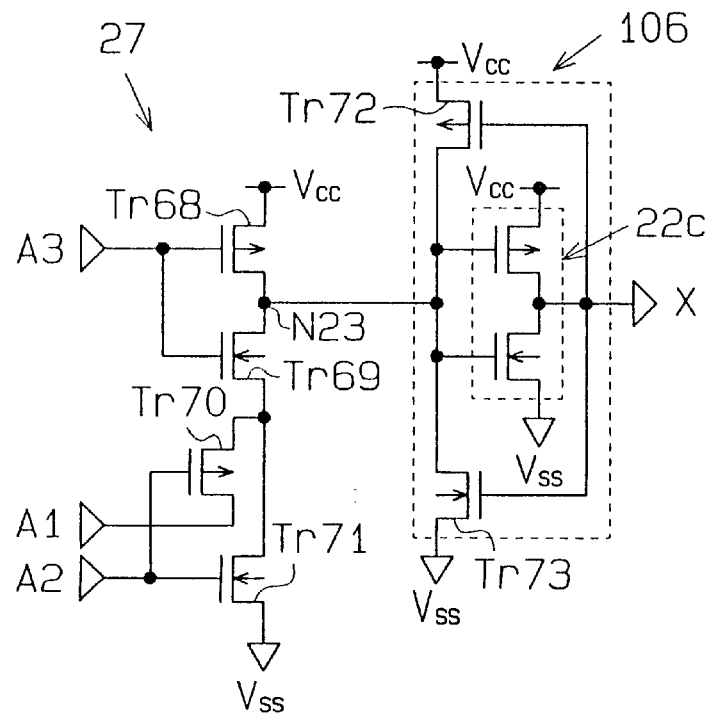
FIG. 33 is a diagram of a CMOS logic circuit according to a sixth embodiment of the invention.

FIG. 33 illustrates a CMOS logic circuit 27 according to a sixth embodiment of the invention, which operates as a 2-wide, 2-AND, 3-input AND-OR-INVERT gate.

The AND-OR-INVERT gate 27 of the sixth embodiment is configured to ensure the full fluctuation of the output signal X between the level of the high potential power supply $V_{CC}$ and the level of the low-potential power supply $V_{SS}$.

The AND-OR-INVERT gate 26 of the fifth embodiment may output a signal X having a level lower than that the H level of the input signal A3 by the threshold value of the transistor Tr65. The AND-OR-INVERT gate 26 also may output a signal X having a level lower than the H level of the input signal A2 by the threshold values of the transistors Tr64 and Tr65. Therefore, the output signal X does not fully reach the high potential of the power supply V, even when the potential level of the high potential power supply $V_{CC}$ is input as the H-level input signals A1–A3.

In the embodiment of FIG. 33, the input signal A1 is input to the drain (source) of a PMOS transistor Tr70, and the input signal A2 is input to the gates of the transistor Tr70 and an NMOS transistor Tr71. The input signal A3 is input to the gates of a PMOS transistor Tr68 and an NMOS transistor Tr69.

The transistor Tr68 has a source connected to the high potential power supply $V_{CC}$ and a drain connected to the drain (source) of the transistor Tr69, thus forming a node N23.

The source (drain) of the transistor Tr69 is connected to the source (drain) of the transistor Tr70 and the drain of the transistor Tr71 a source of which is connected to the low-potential power supply $V_{SS}$. The node N23 is connected to a CMOS inverter 22c which outputs the output signal X. The output signal X is input to the gates of a PMOS transistor Tr72 and an NMOS transistor Tr73.

The transistor Tr72 has a source connected to the high potential power supply $V_{CC}$ and a drain connected to the node N23. The transistor Tr73 has a drain connected to the node N23 and a source connected to the low-potential power supply $V_{SS}$. The inverter 22c and the transistors Tr72 and Tr73 constitute an output signal stabilizing circuit 106.

The AND-OR-INVERT gate 27 performs an operation based on the truth values shown in FIG. 9 and is represented by the symbol shown in FIG. 8. That is, the AND-OR-INVERT gate 27 generates an AND logic signal from the input signal A1 and the inverted signal of the input signal A2. The AND-OR-INVERT gate 27 further generates an NOR logic signal, from the AND logic signal and the inverted signal of the input signal A3, as the output signal X.

When the input signals A1, A2 and A3 all are "0", the transistors Tr68 and Tr70 are turned on and the transistors Tr69 and Tr71 are turned off. Consequently, the node N23 has an H level and the output signal X has an L level. Further, the transistor Tr72 is turned on and the transistor Tr73 is turned off, setting the node N23 nearly to the level of the high potential power supply $V_{CC}$.

When the input signals A1, A2 and A3 are "1, 0, 0", the transistors Tr68 and Tr70 are turned on and the transistors Tr69 and Tr71 are turned off. Consequently, the node N23 has an H level and the output signal X has an L level. Further, the transistor Tr72 is turned on and the transistor Tr73 is turned off, causing the node N23 to have substantially the level of the high potential power supply $V_{CC}$.

When the input signals A1, A2 and A3 are "0, 1, 0", the transistors Tr68 and Tr71 are turned on and the transistors Tr69 and Tr70 are turned off. As a result, the node N23 has an H level and the output signal X has an L level. Further, the transistor Tr72 is turned on and the transistor Tr73 is turned off, causing the node N23 to have substantially the level of the high potential power supply $V_{CC}$.

When the input signals A1, A2 and A3 are "1, 1, 0", the transistors Tr68 and Tr71 are turned on and the transistors Tr69 and Tr70 are turned off. This causes the node N23 to have an H level so that the output signal X has an L level Further, the transistor Tr72 is turned on and the transistor Tr73 is turned off, setting the node N23 to substantially the level of the high potential power supply $V_{CC}$.

When the input signals A1, A2 and A3 are "0, 0, 1", the transistors Tr69 and Tr70 are turned on and the transistors Tr68 and Tr71 are turned off. As a result, the input signal A1 is sent to the node N23 via the transistors Tr70 and Tr69, causing the node N23 to have an L level. At this time, the node N23 has a level higher than that of the input signal A1 by the threshold value of the transistor Tr70. However, the level of the node N23 has substantially the level of the low-potential power supply $V_{SS}$ by the ON action of the transistor Tr73. The transistor Tr73 is turned on if the output signal X has a level higher than that of the low-potential power supply $V_{SS}$ by the threshold value of the transistor Tr73. Therefore, the operation of the inverter 22c pulls up the output signal X substantially to the level of the high potential power supply $V_{CC}$, so that an output signal X has an H Level.

When the input signals A1, A2 and A3 are "1, 0, 1", the transistors Tr69 and Tr70 are turned on and the transistors Tr68 and Tr71 are turned off. As a result, the input signal A1 is sent to the node N23 via the transistors Tr70 and Tr69, causing the node N23 to have an H level. At this time, the node N23 has a level lower than that of the input signal A1 by the threshold value of the transistor Tr69. However, the level of the node N23 has substantially the level of the low-potential power supply $V_{SS}$ by the ON action of the transistor Tr72. The transistor Tr72 is turned if the output signal X has a level lower than that of the high potential power supply $V_{CC}$ by the threshold value of the transistor Tr72. Therefore, the operation of the inverter 22c pulls down the output signal X substantially to the level of the low-potential power supply $V_{SS}$, so that the output signal X has an L level.

When the input signals A1, A2 and A3 are "0, 1, 1", the transistors Tr69 and Tr71 are turned on and the transistors Tr68 and Tr70 are turned off. Consequently, the level of the node N23 is pulled down substantially to the level of the low-potential power supply $V_{SS}$ and has an L level, causing the output signal X to have an H level. Further, the transistor Tr72 is turned off and the transistor Tr73 is turned on, setting the node N23 nearly to the level of the low-potential power supply $V_{SS}$.

When the input signals A1, A2 and A3 are "1, 1, 1", the transistors Tr69 and Tr71 are turned on and the transistors Tr68 and Tr70 are turned off. Consequently, the node N23 has an L level, causing the output signal X to have an H level. Further, the transistor Tr72 is turned off and the transistor Tr73 is turned on, causing the node N23 to have substantially the level of the low-potential power supply The AND-OR-INVERT gate 27 has the following advantages.

(A) Since the 2-wide, 2-AND, 3-input AND-OR-INVERT gate 27 is constituted of eight MOS transistors, the number of required elements is reduced as compared with the third prior art example. The circuit area is reduced accordingly.

(B) It is possible to reduce the chip area of any semiconductor integrated circuit device that uses many such 2-wide, 2-AND, 3-input AND-OR-INVERT gates 27.

(C) The output signal stabilizing circuit 106 permits the output signal X to fully fluctuate between the levels of the high-potential power supply $V_{CC}$ and the low-potential power supply $V_{SS}$, as compared with the fifth embodiment, even if the amplitudes of the input signals A1–A3 become smaller.

Seventh Embodiment

Figure 34:
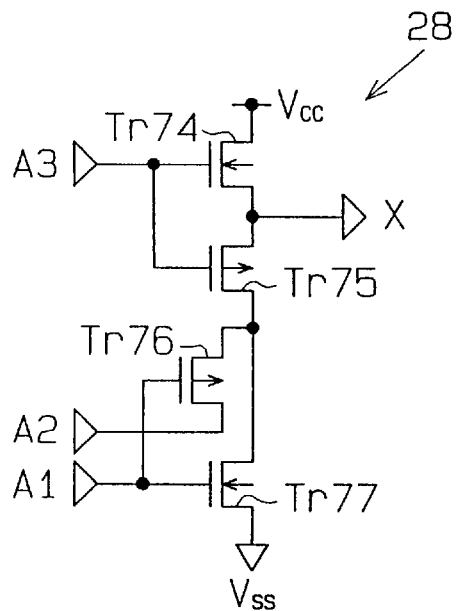
FIG. 34 is a diagram of a CMOS logic circuit according to a seventh embodiment of the invention.

FIG. 34 illustrates a CMOS logic circuit 28 according to a seventh embodiment of the invention, which operates as a 2-wide, 2-AND, 3-input AND-OR gate.

The input signal A2 is input to the drain (source) of a PMOS transistor Tr76, and the input signal A1 is input to the gates of the transistor Tr76 and an NMOS transistor Tr77. The input signal A3 is input to the gates of a PMOS transistor Tr75 and an NMOS transistor Tr74.

The transistor Tr74 has a drain connected to the high-potential power supply $V_{CC}$ and a source connected to the source (drain) of the transistor Tr75. The output signal X is output from the source of the transistor Tr74. The drain (source) of the transistor Tr75 is connected to the source (drain) of the transistor Tr76 and the drain of the transistor Tr77 a source of which is connected to the low-potential power supply $V_{SS}$.

Figure 13:
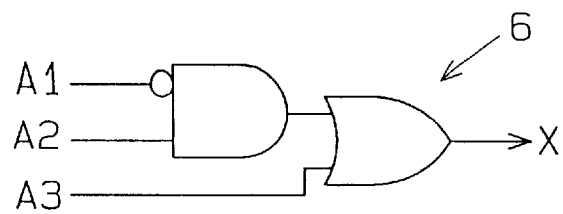
FIG. 13 is a diagram showing a symbol of the fifth prior art example.
Figures 14, 15:
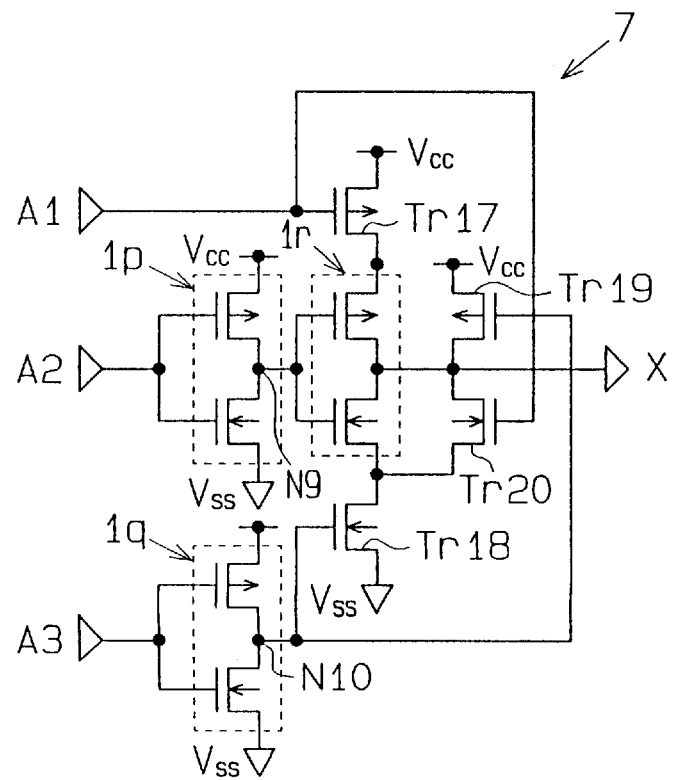
FIG. 14 is an explanatory diagram showing truth values of the fifth prior art example.
FIG. 15 is a diagram of a CMOS logic circuit according to a sixth prior art example.
Figure 16:
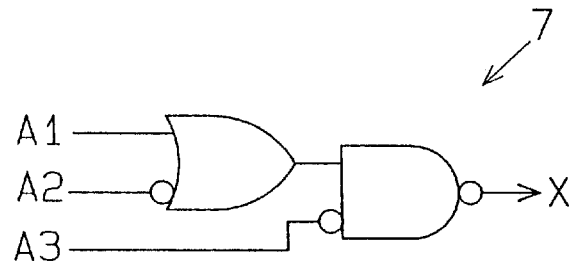
FIG. 16 is a diagram showing a symbol of the sixth prior art example.
Figure 17:
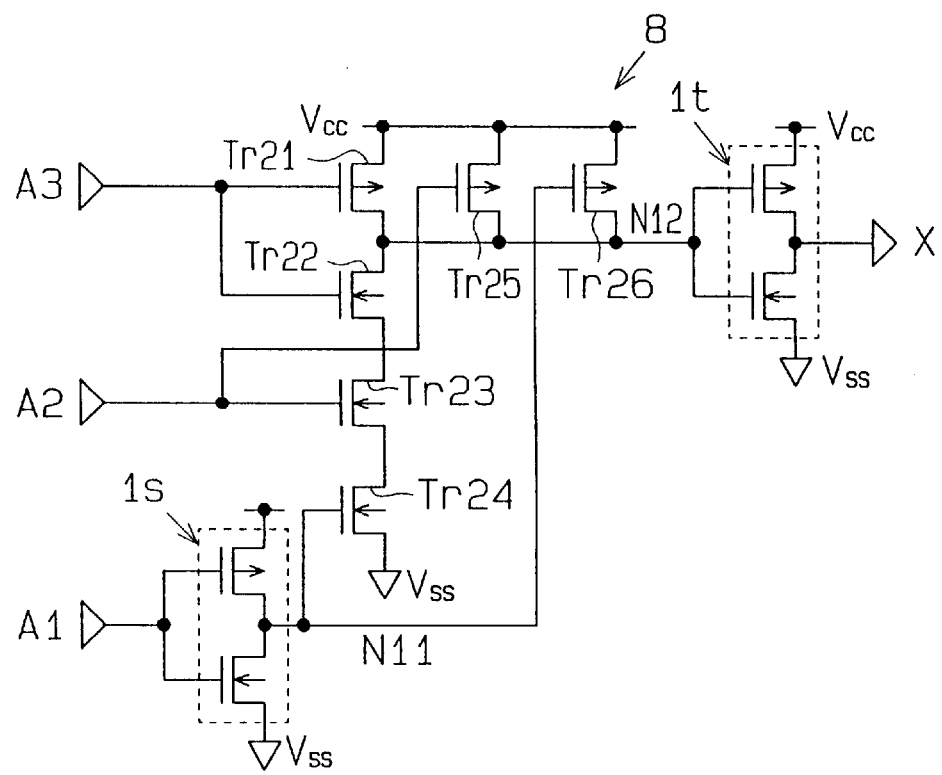
FIG. 17 is a diagram of a CMOS logic circuit according to a seventh prior art example.

The AND-OR gate 28 performs an operation based on the truth values shown in FIG. 14 and is represented by the symbol shown in FIG. 13. That is, the AND-OR gate 28 generates an AND logic signal from the inverted signal of the input signal A1 and the input signal A2. The AND-OR gate 28 further generates an OR logic signal, from the AND logic signal and the input signal A3, as an output signal X.

When the input signals A1, A2 and A3 all are "0", the transistors Tr75 and Tr76 are turned on and the transistors Tr74 and Tr77 are turned off. Therefore, the input signal A2 is output as the output signal X via the transistors Tr75 and Tr76, so that the output signal X has an L level. At this time, the output signal X has a level higher than that of the input signal A2 by the threshold values of the transistors Tr75 and Tr76. Therefore, L-level output signal X, which is higher than the level of the low-potential power supply $V_{SS}$, is output even when the potential level of the low-potential power supply $V_{SS}$ is input as the input signals A1–A3.

When the input signals A1, A2 and A3 are "1, 0, 0", the transistors Tr75 and Tr77 are turned on and the transistors Tr74 and Tr76 are turned off. Therefore, the output signal X has an L level. At this time, the output signal X has a level higher than that of the low-potential power supply $V_{SS}$ by the threshold value of the transistor Tr75.

When the input signals A1, A2 and A3 are "0, 1, 0", the transistors Tr75 and Tr76 are turned on and the transistors Tr74 and Tr77 are turned off. Thus, the input signal A2 is output as the output signal X, so that an output signal X has an H Level.

When the input signals A1, A2 and A3 are "1, 1, 0", the transistors Tr75 and Tr77 are turned on and the transistors Tr74 and Tr76 are turned off. Therefore, the output signal X has an L level. At this time, the output signal X has a level higher than that of the low-potential power supply $V_{SS}$ by the threshold value of the transistor Tr75.

When the input signals A1, A2 and A3 are "0, 0, 1", the transistors Tr74 and Tr76 are turned on and the transistors Tr75 and Tr77 are turned off. The output signal X therefore has an H level.

When the input signals A1, A2 and A3 are "1, 0, 1", the transistors Tr74 and Tr77 are turned on and the transistors Tr75 and Tr76 are turned off. The output signal X thus has an H level.

When the input signals A1, A2 and A3 are "0, 1, 1", the transistors Tr74 and Tr76 are turned on and the transistors Tr75 and Tr77 are turned off. Therefore, the output signal X has an H level.

When the input signals A1, A2 and A3 are "1, 1, 1", the transistors Tr74 and Tr77 are turned on and the transistors Tr75 and Tr76 are turned off. The output signal X therefore has an H level.

The AND-OR gate 28 has the following advantages.

(A) Since the 2-wide, 2-AND, 3-input AND-OR gate 28 is constituted of four MOS transistors, the number of required elements is reduced as compared with the fifth prior art example. The circuit area is reduced accordingly.

(B) As no inverter is required, no through current flows from the high-potential power supply $V_{CC}$ to the low-potential power supply $V_{SS}$. It is therefore possible to reduce the consumed power.

(C) It is possible to reduce the chip area of any semiconductor integrated circuit device that uses many such 2-wide, 2-AND, 3-input AND-OR gates 28.

(D) It is possible to reduce the power consumption of any semiconductor integrated circuit device that uses many such 2-wide, 2-AND, 3-input AND-OR gates 28.

Eighth Embodiment

Figure 35:
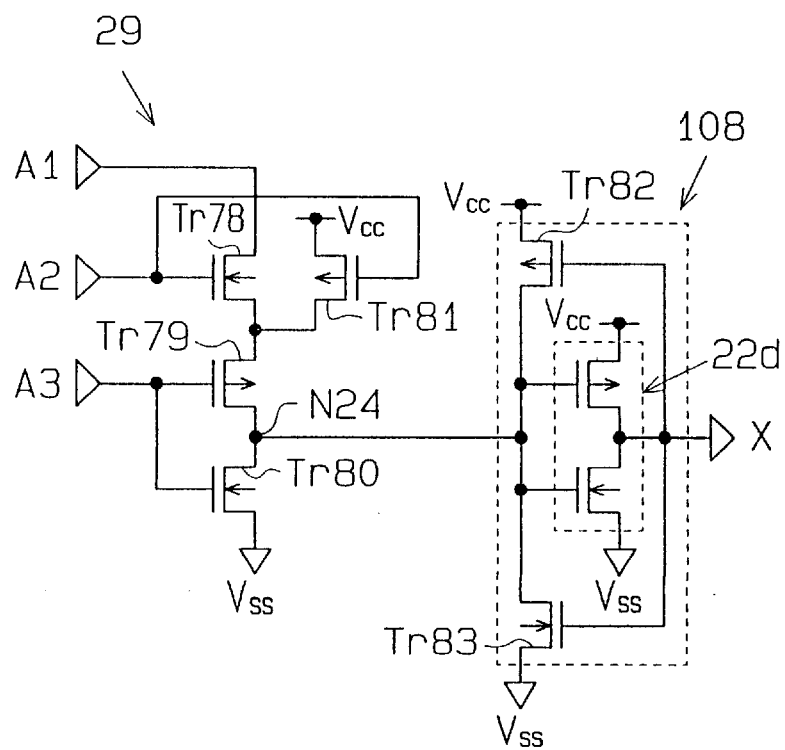
FIG. 35 is a diagram of a CMOS logic circuit according to an eighth embodiment of the invention.

FIG. 35 illustrates a CMOS logic circuit 29 according to an eighth embodiment of the invention, which operates as a 2-wide, 2-AND, 3-input AND-OR gate.

The AND-OR gate 29 is configured to ensure that the L-level output signal X is pulled down to the level of the low-potential power supply $V_{SS}$ so that the output signal X fully fluctuates between the level of the high-potential power supply $V_{CC}$ and the level of the low-potential power supply $V_{SS}$.

In the AND-OR gate 28 of the seventh embodiment, the L-level output signal X does not fully reach the low potential of the power supply $V_{SS}$ even if the L level of the input signals A1–A3 is set to the potential level of the low-potential power supply $V_{SS}$.

In the embodiment of FIG. 35, the input signal A2 is input to the gates of an NMOS transistor Tr78 and a PMOS transistor Tr81, and the input signal A1 is input to the drain (source) of the transistor Tr78. The input signal A3 is input to the gates of an NMOS transistor Tr80 and a PMOS transistor Tr79. The transistor Tr79 has a source (drain) connected to the source (drain) of the transistor Tr78, and a drain (source) connected to the drain of the transistor Tr80, thus forming a node N24. The source of the transistor Tr80 is connected to the low-potential power supply $V_{SS}$.

The transistor Tr81 has a source connected to the high-potential power supply $V_{CC}$ and a drain connected to the source (drain) of the transistor Tr79. The node N24 is connected to a CMOS inverter 22*d* which outputs the output signal X. The output signal X is input to the gates of a PMOS transistor Tr82 and an NMOS transistor Tr83.

The transistor Tr82 has a source connected to the high-potential power supply $V_{CC}$ and a drain connected to the node N24. The transistor Tr83 has a drain connected to the node N24 and a source connected to the low-potential power supply $V_{SS}$. The inverter 22*d* and the transistors Tr82 and Tr83 constitute an output signal stabilizing circuit 108.

The 2-wide, 2-AND, 3-input AND-OR gate 29 performs an operation based on the truth values shown in FIG. 14 and is represented by the symbol shown in FIG. 13. That is, the AND-OR gate 29 generates an AND logic signal from the inverted signal of the input signal A1 and the input signal A2. The AND-OR gate 29 further generates an OR logic signal, from the AND logic signal and the input signal A3, as an output signal X.

When the input signals A1, A2 and A3 all are "0", the transistors Tr81 and Tr79 are turned on and the transistors Tr78 and Tr80 are turned off. This sets the level of the node N24 to substantially the level of the high-potential power supply $V_{CC}$ so that the node N24 has an H level. Consequently, the operation of the inverter 22*d* lowers the level of the output signal X to the level of the low-potential power supply $V_{SS}$ so that the output signal X has an L level. Further, the transistor Tr82 is turned on and the transistor Tr83 is turned off, setting the level of the node N24 nearly to the level of the high-potential power supply $V_{CC}$.

When the input signals A1, A2 and A3 are "1, 0, 0", the transistors Tr81 and Tr79 are turned on and the transistors Tr78 and Tr80 are turned off. Consequently, the node N24 has an H level and the output signal X has an L level.

When the input signals A1, A2 and A3 are "0, 1, 0", the transistors Tr78 and Tr79 are turned on and the transistors Tr81 and Tr80 are turned off. As a result, the L-level input signal A1 is sent to the node N24 via the transistors Tr78 and Tr79, causing the node N24 to have the L level. At this time, the node N24 has a level higher than that of the input signal A1 by the threshold value of the transistor Tr79.

When the level of the node N24 goes to the L level, the operation of the inverter 22*d* causes the output signal X to have an H level. Consequently, the transistor Tr82 is turned off and the transistor Tr83 is turned on, setting the level of the node N24 to substantially the level of the low-potential power supply $V_{SS}$. Therefore, the H-level output signal X is pulled up to the level of the high-potential power supply $V_{CC}$.

When the input signals A1, A2 and A3 are "1, 1, 0", the transistors Tr78 and Tr79 are turned on and the transistors Tr81 and Tr80 are turned off. As a result, the H-level input signal A1 is sent to the node N24 via the transistors Tr78 and Tr79, causing the node N24 to have the H level. At this time, the node N24 has a level lower than that of the input signal A1 by the threshold value of the transistor Tr79.

When the node N24 has an H level, the operation of the inverter 22*d* sets the level of the output signal X to the L level. Consequently, the transistor Tr82 is turned on and the transistor Tr83 is turned off, setting the level of the node N24 substantially to the level of the high-potential power supply $V_{CC}$. Therefore, the L-level output signal X is pulled down to the level of the low-potential power supply $V_{SS}$.

When the input signals A1, A2 and A3 are "0, 0, 1", the transistors Tr81 and Tr80 are turned on and the transistors Tr78 and Tr79 are turned off. As a result, the node N24 has an L level and the output signal X has an H level. Further, the transistor Tr82 is turned off and the transistor Tr83 is turned on, thus setting the level of the node N24 substantially to the level of the low-potential power supply $V_{SS}$.

When the input signals A1, A2 and A3 are "1, 0, 1", the transistors Tr81 and Tr80 are turned on and the transistors Tr78 and Tr79 are turned off. Consequently, the node N24 has an L level and the output signal X has an H level. Further, the transistor Tr82 is turned off and the transistor Tr83 is turned on, thus setting the level of the node N24 substantially to the level of the low-potential power supply $V_{SS}$.

When the input signals A1, A2 and A3 are "0, 1, 1", the transistors Tr78 and Tr80 are turned on and the transistors Tr81 and Tr79 are turned off. As a result, the node N24 has an L level and the output signal X has an H level. Further, the transistor Tr82 is turned off and the transistor Tr83 is turned on, thus causing the node N24 to have substantially the level of the low-potential power supply $V_{SS}$.

When the input signals A1, A2 and A3 are "1, 1, 1", the transistors Tr78 and Tr80 are turned on and the transistors Tr81 and Tr79 are turned off. Consequently, the node N24 has an L level and the output signal X has an H level. Further, the transistor Tr82 is turned off and the transistor Tr83 is turned on, thus causing the node N24 to have substantially the level of the low-potential power supply $V_{SS}$.

The AND-OR gate 29 has the following advantages.

(A) Since the 2-wide, 2-AND, 3-input AND-OR gate 29 is constituted of eight MOS transistors, the number of required elements is reduced as compared with the fifth prior art example. The circuit area is reduced accordingly.

(B) It is possible to reduce the chip area of any semiconductor integrated circuit device that uses many such 2-wide, 2-AND, 3-input AND-OR gates 29.

(C) The output signal stabilizing circuit 108 permits the output signal X to fully fluctuate between the levels of the high-potential power supply $V_{CC}$ and the low-potential power supply $V_{SS}$ even if the amplitudes of the input signals A1–A3 become smaller.

Ninth Embodiment

Figure 36:
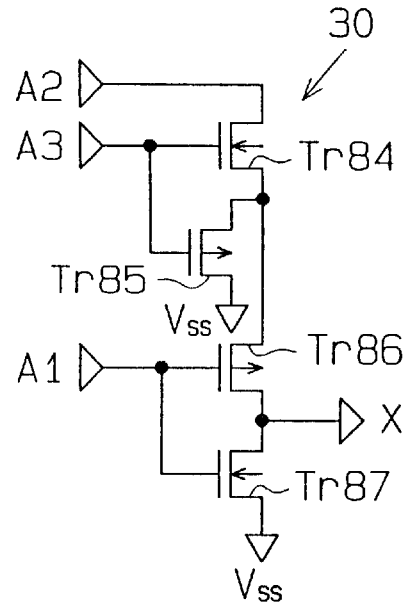
FIG. 36 is a diagram of a CMOS logic circuit according to a ninth embodiment of the invention.

FIG. 36 illustrates a CMOS logic circuit 30 according to a ninth embodiment of the invention, which operates as a 3-input AND gate.

The input signal A1 is input to the gates of an NMOS transistor Tr87 and a PMOS transistor Tr86, and the input signal A2 is input to the drain (source) of an NMOS transistor Tr84. The input signal A3 is input to the gates of the transistor Tr84 and a PMOS transistor Tr85. The transistor Tr84 has a source (drain) connected to the source of the transistor Tr85 and the source (drain) of the transistor Tr86.

The drain of the transistor Tr85 is connected to the low-potential power supply $V_{SS}$. The drain (source) of the transistor Tr86 is connected to the drain of the transistor Tr87 a source of which is connected to the low-potential power supply $V_{SS}$. The output signal X is output from the drain of the transistor Tr87.

Figure 18:
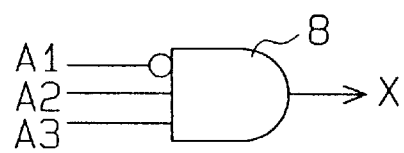
FIG. 18 is a diagram showing a symbol of the seventh prior art example.
Figures 19, 20:
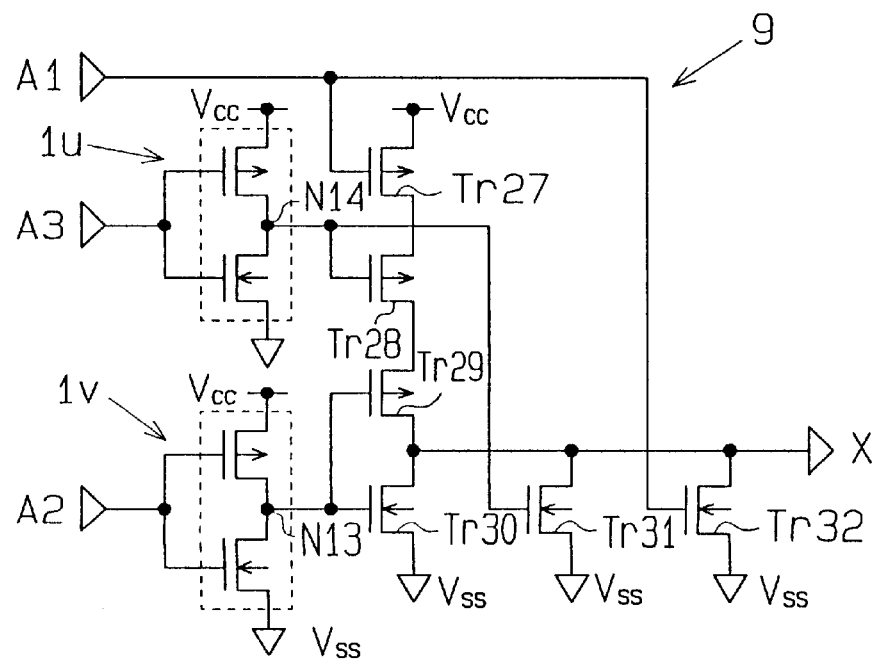
FIG. 19 is an explanatory diagram showing truth values of the seventh prior art example.
FIG. 20 is a diagram of a CMOS logic circuit according to an eighth prior art example.
Figure 21:
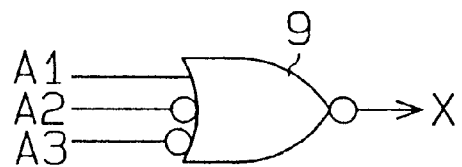
FIG. 21 is a diagram showing a symbol of the eighth prior art example.
Figure 22:
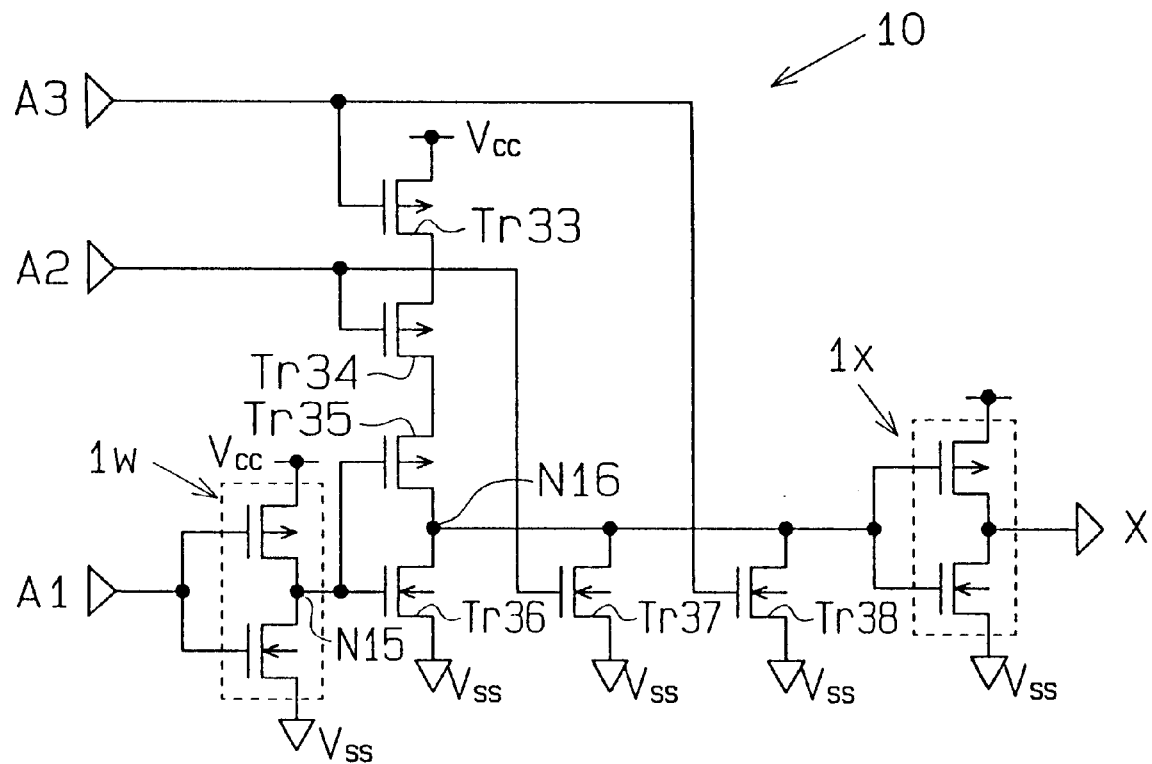
FIG. 22 is a diagram of a CMOS logic circuit according to a ninth prior art example.

The AND gate 30 performs an operation based on the truth values shown in FIG. 19 and is represented by the symbol shown in FIG. 18. That is, the AND gate 30 generates an AND logic signal, from the inverted signal of the input signal A1 and the input signals A2 and A3, as an output signal X.

When the input signals A1, A2 and A3 all are "0", the transistors Tr85 and Tr86 are turned on and the transistors Tr84 and Tr87 are turned off. Therefore, the output signal X has an L level.

When the input signals A1, A2 and A3 are "1, 0, 0", the transistors Tr85 and Tr86 are turned on and the transistors Tr84 and Tr86 are turned off. The output signal X thus has an L level. At this time, the L-level output signal X falls down nearly to the level of the low-potential power supply $V_{SS}$.

When the input signals A1, A2 and A3 are "0, 1, 0", the transistors Tr85 and Tr86 are turned on and the transistors Tr84 and Tr87 are turned off. The output signal X thus has an L level. At this time, the L-level output signal X does not fall down to the level of the low-potential power supply $V_{SS}$.

When the input signals A1, A2 and A3 are "1, 1, 0", the transistors Tr85 and Tr87 are turned on and the transistors Tr84 and Tr86 are turned off. The output signal X therefore has an L level.

When the input signals A1, A2 and A3 are "0, 0, 1", the transistors Tr84 and Tr86 are turned on and the transistors Tr85 and Tr87 are turned off. Therefore, the input signal A2 is output as the output signal X via the transistors Tr84 and Tr86, so that the output signal X has an L level.

When the input signals A1, A2 and A3 are "1, 0, 1", the transistors Tr84 and Tr87 are turned on and the transistors Tr85 and Tr86 are turned off. The output signal X has an L level.

When the input signals A1, A2 and A3 are "0, 1, 1", the transistors Tr84 and Tr86 are turned on and the transistors Tr85 and Tr87 are turned off. Therefore, the input signal A2 is output as the output signal X via the transistors Tr84 and Tr86, so that an output signal X has an H Level.

When the input signals A1, A2 and A3 are "1, 1, 1", the transistors Tr84 and Tr87 are turned on and the transistors Tr85 and Tr86 are turned off. Thus, the output signal X has an L level.

The AND gate 30 has the following advantages.

(A) Since the 3-input AND gate 30 is constituted of four MOS transistors, the number of required elements is reduced as compared with the seventh prior art example. The circuit area is reduced accordingly.

(B) Because of no inverter required, no through current flows from the high-potential power supply $V_{CC}$ to the low-potential power supply $V_{SS}$. It is thus possible to reduce the power consumption.

(C) It is possible to reduce the chip area of any semiconductor integrated circuit device that uses many such 3-input AND gates 30.

(D) It is possible to reduce the power consumption of any semiconductor integrated circuit device which uses such 3-input AND gates 30.

Tenth Embodiment

Figure 37:
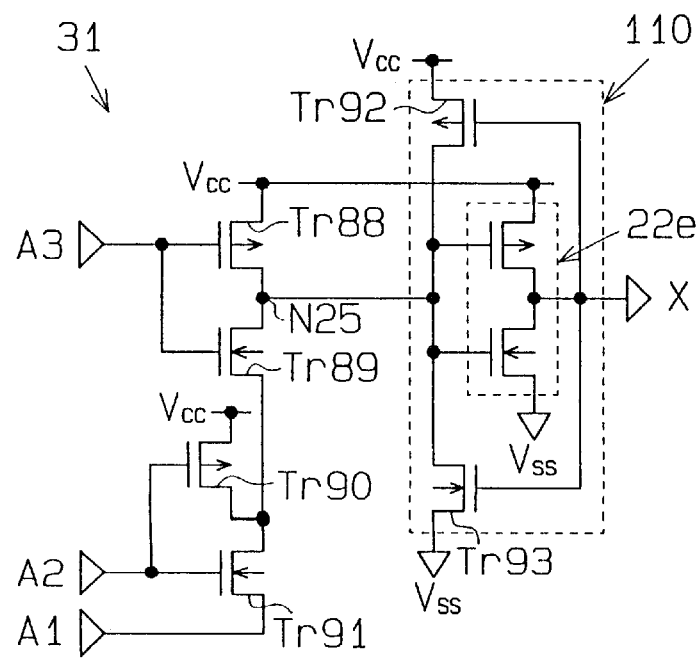
FIG. 37 is a diagram of a CMOS logic circuit according to a tenth embodiment of the invention.

FIG. 37 illustrates a CMOS logic circuit 31 according to a tenth embodiment of the invention, which operates as a 3-input AND gate.

The 3-input AND gate 31 is configured to ensure the full fluctuation of the output signal X between the level of the high-potential power supply $V_{CC}$ and the level of the low-potential power supply $V_{SS}$.

In the 3-input AND gate 31 of the ninth embodiment, the output signal X does not fully reach the low potential of the power supply $V_{SS}$. Furthermore, the output signal X does not fully reach the high potential of the power supply $V_{CC}$.

In the embodiment of FIG. 37, the input signal A3 is input to the gates of a PMOS transistor Tr88 and an NMOS transistor Tr89. The input signal A2 is input to the gates of a PMOS transistor Tr90 and an NMOS transistor Tr91.

The transistor Tr88 has a source connected to the high-potential power supply $V_{CC}$ and a drain connected to the drain (source) of the transistor Tr89, thus forming a node N25. The source (drain) of the transistor Tr89 is connected to the drain (source) of the transistor Tr91 a source (drain) of which the input signal A1 is input. The transistor Tr90 has a source connected to the high-potential power supply $V_{CC}$ and a drain connected to the drain (source) of the transistor Tr91.

The node N25 is connected to a CMOS inverter 22e which outputs the output signal X. The output signal X is input to the gates of a PMOS transistor Tr92 and an NMOS transistor Tr93.

The transistor Tr92 has a source connected to the high-potential power supply $V_{CC}$ and a drain connected to the node N25. The transistor Tr93 has a drain connected to the node N25 and a source connected to the low-potential power supply $V_{SS}$. The inverter 22e and the transistors Tr92 and Tr93 constitute an output signal stabilizing circuit 110.

The 3-input AND gate 31 performs an operation based on the truth values shown in FIG. 19 and is represented by the symbol shown in FIG. 18. That is, AND gate 31 generates an AND logic signal, from the inverted signal of the input signal A1 and the input signals A2 and A3, as an output signal x.

When the input signals A1, A2 and A3 all are "0", the transistors Tr88 and Tr90 are turned on and the transistors Tr89 and Tr91 are turned off. Consequently, the node N25 has a level substantially equal to the level of the high-potential power supply $V_{CC}$ and thus has an H level, causing the output signal X to have an L level. Further, the transistor Tr92 is turned on and the transistor Tr93 is turned off, setting the level of the node N25 nearly to the level of the high-potential power supply $V_{CC}$.

When the input signals A1, A2 and A3 are "1, 0, 0", the transistors Tr88 and Tr90 are turned on and the transistors Tr89 and Tr91 are turned off. Consequently, the output signal X has an L level and the node N25 has substantially the level of the high-potential power supply $V_{CC}$.

When the input signals A1, A2 and A3 are "0, 1, 0", the transistors Tr88 and Tr91 are turned on and the transistors Tr89 and Tr90 are turned off. As a result, the node N25 has an H level and the output signal X has an L level. Further, the transistor Tr92 is turned on and the transistor Tr93 is turned off, causing the node N25 to have substantially the level of the high-potential power supply $V_{CC}$.

When the input signals A1, A2 and A3 are "1, 1, 0", the transistors Tr88 and Tr91 are turned on and the transistors Tr89 and Tr90 are turned off. This causes the node N25 to have an H level so that the output signal X has an L level. Further, the transistor Tr92 is turned on and the transistor Tr93 is turned off, setting the level of the node N25 to substantially the level of the high-potential power supply $V_{CC}$.

When the input signals A1, A2 and A3 are "0, 0, 1", the transistors Tr89 and Tr90 are turned on and the transistors Tr88 and Tr91 are turned off. As a result, the node N25 has an H level. At this time, the node N25 has a level lower than that of the high-potential power supply $V_{CC}$ by the threshold value of the transistor Tr89.

When the node N25 has an H level, the operation of the inverter 22e causes the output signal X to have an L level. Consequently, the transistor Tr92 is turned on and the transistor Tr93 is turned off, setting the level of the node N25 substantially to the level of the high-potential power supply $V_{CC}$. Therefore, the signal X has the L level pulled down to the level of the low-potential power supply $V_{SS}$.

When the input signals A1, A2 and A3 are "1, 0, 1", the transistors Tr89 and Tr90 are turned on and the transistors Tr88 and Tr91 are turned off. As a result, the output signal X has an L level.

When the input signals A1, A2 and A3 are "0, 1, 1", the transistors Tr89 and Tr91 are turned on and the transistors Tr88 and Tr90 are turned off. Consequently, the L-level input signal A1 is output to the node N25 via the transistors Tr89 and Tr91, so that the node N25 has an L level and an output signal X has an H Level. Further, the transistor Tr92 is turned off and the transistor Tr93 is turned on, setting the level of the node N25 nearly to the level of the low-potential power supply $V_{SS}$. Thus, the output signal X has the H level pulled up to the level of the high-potential power supply $V_{CC}$.

When the input signals A1, A2 and A3 are "1, 1, 1", the transistors Tr89 and Tr91 are turned on and the transistors Tr88 and Tr90 are turned off. Consequently, the H-level input signal A1 is output to the node N25 via the transistors Tr89 and Tr91 so that the node N25 has an H level. This causes the output signal X to have an L level. At this time, the node N25 has a level lower than that of the input signal A2 by the threshold values of the transistors Tr91 and Tr89. When the node N25 has an H level, causing the output signal X to have the L level, the transistor Tr92 is turned on and the transistor Tr93 is turned off. This sets the level of the node N25 substantially to the level of the high-potential power supply $V_{CC}$ so that the output signal X has the level pulled down to the level of the low-potential power supply $V_{SS}$.

The AND gate 31 has the following advantages.

(A) Since the 3-input AND gate 31 is constituted of eight MOS transistors, the number of required elements is reduced as compared with the seventh prior art example. The circuit area is reduced accordingly.

(B) It is possible to reduce the chip area of any semiconductor integrated circuit device that uses many such 3-input AND gates 31.

(C) The output signal stabilizing circuit 110 permits the output signal X to fully fluctuate between the levels of the high-potential supply $V_{CC}$ and the low-potential power supply $V_{SS}$ even if the amplitudes of the input signals A1 and A2 become smaller.

Eleventh Embodiment

Figure 38:
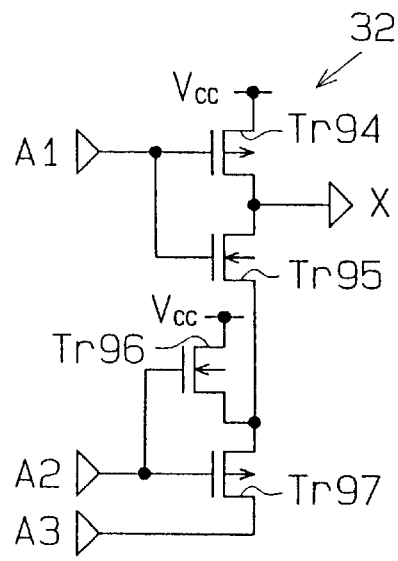
FIG. 38 is a diagram of a CMOS logic circuit according to an eleventh embodiment of the invention.

FIG. 38 illustrates a CMOS logic circuit 32 according to an eleventh embodiment of the invention, which operates as a 3-input OR gate.

The input signal A1 is input to the gates of a PMOS transistor Tr94 and an NMOS transistor Tr95. The input signal A2 is input to the gates of an NMOS transistor Tr96 and a PMOS transistor Tr97. The input signal A3 is input to the drain (source) of the transistor Tr97.

The transistor Tr94 has a source connected to the high-potential power supply $V_{CC}$ and a drain connected to the drain (source) of the transistor Tr95. The source (drain) of the transistor Tr95 is connected to the source (drain) of the transistor Tr97 and the source of the transistor Tr96. The drain of the transistor Tr96 is connected to the high-potential power supply $V_{CC}$. The output signal X is output from the drain of the transistor Tr94.

Figures 23, 24:
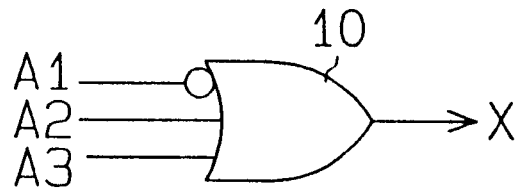
FIG. 23 is a diagram showing a symbol of the ninth prior art example.
FIG. 24 is an explanatory diagram showing truth values of the ninth prior art example.
Figure 25:
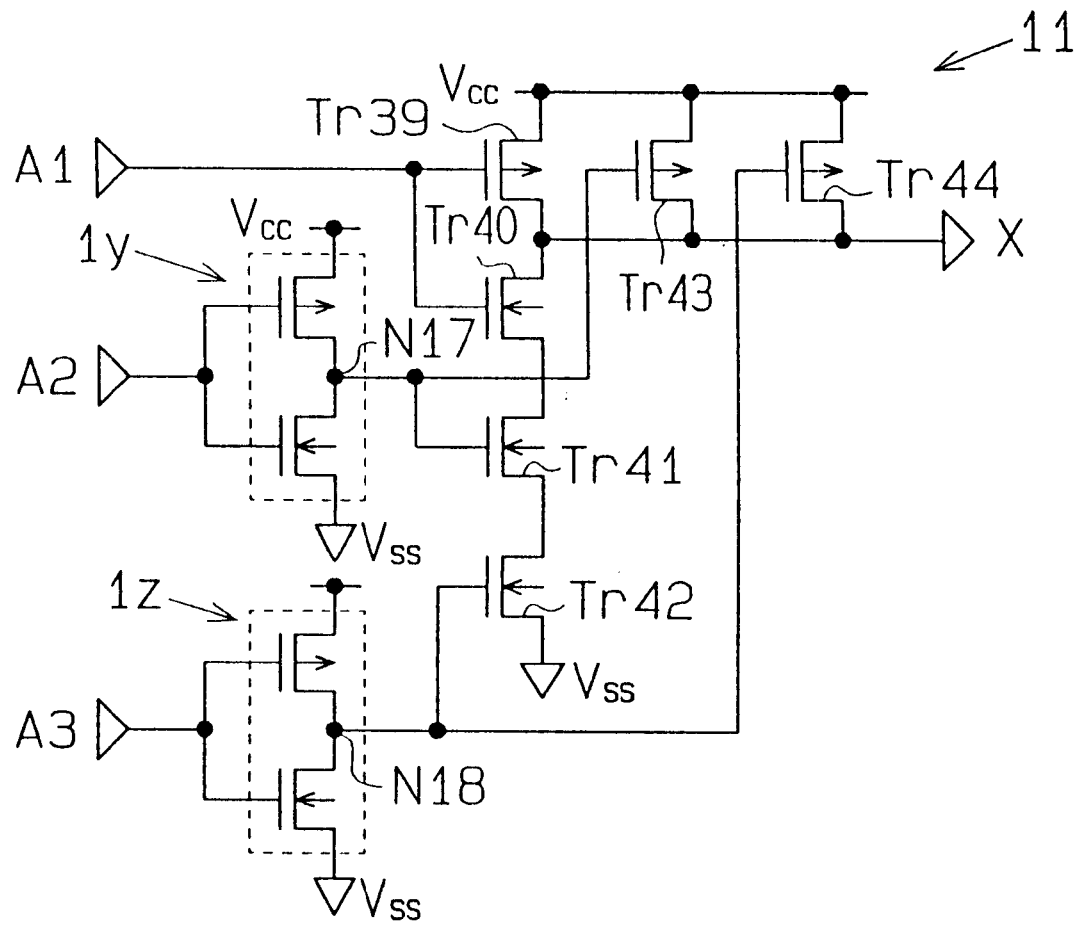
FIG. 25 is a diagram of a CMOS logic circuit according to a tenth prior art example.
Figure 26:
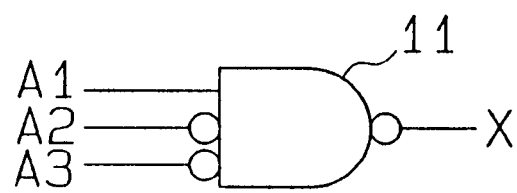
FIG. 26 is a diagram showing a symbol of the tenth prior art example.

The OR gate 32 performs an operation based on the truth values shown in FIG. 24 and is represented by the symbol shown in FIG. 23. That is, the OR gate 32 generates an OR logic signal, from the inverted signal of the input signal A1 and the input signals A2 and A3, as an output signal X.

When the input signals A1, A2 and A3 all are "0", the transistors Tr94 and Tr97 are turned on and the transistors Tr95 and Tr96 are turned off. Therefore, an output signal X has an H Level.

When the input signals A1, A2 and A3 are "1, 0, 0", the transistors Tr95 and Tr97 are turned on and the transistors Tr94 and Tr96 are turned off. Consequently, the input signal A3 is output as the output signal X via the transistors Tr95 and Tr97, so that the output signal X has an L level.

When the input signals A1, A2 and A3 are "0, 1, 0", the transistors Tr94 and Tr96 are turned on and the transistors Tr95 and Tr97 are turned off. An output signal X thus has an H level.

When the input signals A1, A2 and A3 are "1, 1, 0", the transistors Tr95 and Tr96 are turned on and the transistors Tr94 and Tr97 are turned off. The output signal X therefore has an H level.

When the input signals A1, A2 and A3 are "0, 0, 1", the transistors Tr94 and Tr97 are turned on and the transistors Tr95 and Tr96 are turned off. Therefore, the output signal X has an H level.

When the input signals A1, A2 and A3 are "1, 0, 1", the transistors Tr95 and Tr97 are turned on and the transistors Tr94 and Tr96 are turned off. As a result, the input signal A3 is sent out as the output signal X via the transistors Tr95 and Tr97, so that the output signal X has an H level.

When the input signals A1, A2 and A3 are "0, 1, 1", the transistors Tr94 and Tr96 are turned on and the transistors Tr95 and Tr97 are turned off. Therefore, the output signal X has an H level.

When the input signals A1, A2 and A3 are "1, 1, 1", the transistors Tr95 and Tr96 are turned on and the transistors Tr94 and Tr97 are turned off. Thus, the output signal X has an H level. At this time, the output signal X has a level lower than that of the high-potential power supply $V_{CC}$ by the threshold values of the transistors Tr95 and Tr96.

The OR gate 32 has the following advantages.

(A) Since the 3-input OR gate 32 is constituted of four MOS transistors, the number of required elements is reduced as compared with the ninth prior art. The circuit area is reduced accordingly.

(B) Because of no inverter required, no through current flows from the high-potential power supply $V_{CC}$ to the low-potential power supply $V_{SS}$. It is thus possible to reduce the power consumption.

(C) It is possible to reduce the chip area of any semiconductor integrated circuit device that uses many such 3-input OR gates 32.

(D) It is possible to reduce the power consumption of any semiconductor integrated circuit device which uses such 3-input OR gates 32.

Twelfth Embodiment

Figure 39:
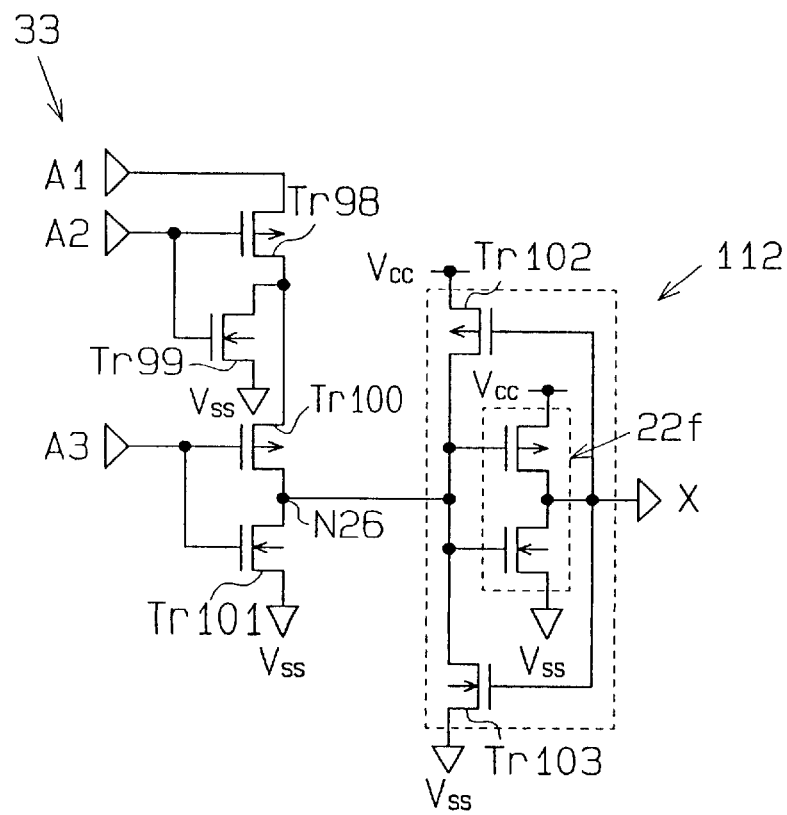
FIG. 39 is a diagram of a CMOS logic circuit according to a twelfth embodiment of the invention.

FIG. 39 illustrates a CMOS logic circuit 33 according to a twelfth embodiment of the invention, which operates as a 3-input OR gates.

The 3-input OR gates 33 of the twelfth embodiment is configured to ensure that the output signal X fully fluctuates between the level of the high-potential power supply $V_{CC}$ and the level of the low-potential power supply $V_{SS}$.

In the 3-input OR gates 32 of the eleventh embodiment the output signal X does not fully reach the high potential of the power supply $V_{CC}$. Furthermore, the output signal X does not fully reach the low potential of the power supply $V_{SS}$.

In the embodiment of FIG. 39, the input signal A1 is input to the source (drain) of a PMOS transistor Tr98. The input signal A2 is input to the gates of the transistor Tr98 and an NMOS transistor Tr99. The input signal A3 is input to the gates of a PMOS transistor Tr100 and an NMOS transistor Tr101.

The transistor Tr98 has a drain (source) connected to the drain of the transistor Tr99 and the source (drain) of the transistor Tr100. The source of the transistor Tr99 is connected to the low-potential power supply $V_{SS}$. The transistor Tr100 has a drain (source) connected to the drain of the transistor Tr101, thus forming a node N26. The source of the transistor Tr101 is connected to the low-potential power supply $V_{SS}$. The node N26 is connected to a CMOS inverter 22f which outputs the output signal X.

The output signal X is input to the gates of a PMOS transistor Tr102 and an NMOS transistor Tr103. The transistor Tr102 has a source connected to the high-potential power supply $V_{CC}$ and a drain connected to the node N26. The transistor Tr103 has a drain connected to the node N26 and a source connected to the low-potential power supply $V_{SS}$. The inverter 22f and the transistors Tr102 and Tr103 constitute an output signal stabilizing circuit 112.

The 3-input OR gates 33 performs an operation based on truth values shown in FIG. 24 and is represented by a symbol shown in FIG. 23. That is, the OR gates 33 generates an OR logic signal, from the inverted signal of the input signal A1 and the input signals A2 and A3, as an output signal X.

When the input signals A1, A2 and A3 all are "0", the transistors Tr98 and Tr100 are turned on and the transistors Tr99 and Tr101 are turned off. Consequently, the input signal A1 is sent to the node N26 via the transistors Tr98 and Tr100, so that the node N26 has an L level. At this time, the signal, which has a level higher than that of the input signal A1 by the threshold values of the transistors Tr100 and Tr98, is supplied to the node N26.

When the node N26 has an L level, the output signal X has an H level, turning off the transistor Tr102 and turning on the transistor Tr103. Then, the level of the node N26 drops nearly to the level of the low-potential power supply $V_{SS}$ so that the output signal X, which has substantially the level of the high-potential power supply $V_{CC}$, is output.

When the input signals A1, A2 and A3 are "1, 0, 0", the transistors Tr98 and Tr100 are turned on and the transistors Tr99 and Tr101 are turned off. Consequently, the input signal A1 is sent to the node N26 via the transistors Tr98 and Tr100, causing the node N26 to have an H level. If the level of the high-potential power supply $V_{CC}$ is input as the H-level input signal A1 then, the node N26 has a level substantially equal to the level of the high-potential power supply $V_{CC}$. When the node N26 has an H level, the output signal X has an L level, turning on the transistor Tr102 and turning off the transistor Tr103.

When the input signals A1, A2 and A3 are "0, 1, 0", the transistors Tr99 and Tr100 are turned on and the transistors Tr98 and Tr101 are turned off. As a result, the node N26 is connected to the low-potential power supply $V_{SS}$ via the transistors Tr100 and Tr99, so that the node N26 has an L level. At this time, the node N26 has a level higher than that of the low-potential power supply $V_{SS}$ by the threshold value of the transistor Tr100.

When the node N26 has an L level, the output signal X is rendered to have the H level by the operation of the inverter 22f, turning on the transistor Tr102 and turning on the transistor Tr103. Then, the node N26 has a level substantially equal to the level of the low-potential power supply $V_{SS}$ so that the output signal X has substantially the level of the high-potential power supply $V_{CC}$.

When the input signals A1, A2 and A3 are "1, 1, 0", the transistors Tr99 and Tr100 are turned on and the transistors Tr98 and Tr101 are turned off. As in the above case, the node N26 has an L level and the output signal X has an H level.

When the input signals A1, A2 and A3 are "0, 0, 1", the transistors Tr98 and Tr101 are turned on and the transistors Tr99 and Tr100 are turned off, causing the node N26 to have the L level or substantially the level of the low-potential power supply $V_{SS}$. When the node N26 has an L level, the output signal X has an H level, turning off the transistor Tr102 and turning on the transistor Tr103. Therefore, the output signal X has a level substantially equal to the level of the high-potential power supply $V_{CC}$.

When the input signals A1, A2 and A3 are "1, 0, 1", the transistors Tr98 and Tr101 are turned on and the transistors Tr99 and Tr100 are turned off. This sets the level of the node N26 to the L level or substantially the level of the low-potential power supply $V_{SS}$. As in the above case, the output signal X has an H level or substantially the level of the high-potential power supply $V_{CC}$.

When the input signals A1, A2 and A3 are "0, 1, 1", the transistors Tr99 and Tr101 are turned on and the transistors Tr98 and Tr100 are turned off. This sets the level of the node N26 to the L level or substantially the level of the low-potential power supply $V_{SS}$. As in the above case, the output signal X, which has the H level or substantially the level of the high-potential power supply $V_{CC}$, is output.

When the input signals A1, A2 and A3 are "1, 1, 1", the transistors Tr99 and Tr101 are turned on and the transistors Tr98 and Tr100 are turned off. As a result, the level of the node N26 has an L level or substantially the level of the low-potential power supply $V_{SS}$. As in the above case, the output signal X, which has the H level or substantially the level of the high-potential power supply $V_{CC}$, is output.

The OR gate 33 has the following advantages.

(A) Since the 3-input OR gate 33 is constituted of eight MOS transistors, the number of required elements is reduced as compared with the ninth prior art example. The circuit area is reduced accordingly.

(B) It is possible to reduce the chip area of any semiconductor integrated circuit device that uses many such 3-input OR gates 33.

(C) The output signal stabilizing circuit 112 permits the output signal X to fully fluctuate between the levels of the high-potential power supply $V_{CC}$ and the low-potential power supply $V_{SS}$ even if the amplitudes of the input signals A1 and A2 become smaller.

As illustrated in the first and third embodiments, each 2-input logic circuit is constituted of two transistors. As illustrated in the fifth, seventh, ninth and eleventh embodiments, each of the 3-input logic circuits is constituted of four transistors. That is, with the number of inputs being n, an n-input logic circuit is constituted of (2n−2) transistors.

Each 2-input logic circuit of the first and second prior art examples is constituted of six transistors. Each 3-input logic circuit of third to tenth prior art example is constituted of ten transistors. That is, with the number of inputs being n, (4n−2) transistors are needed for an n-input logic circuit.

According to the individual embodiments of the present invention, the number of elements is reduced as compared with the associated prior art.

The circuits of the second and fourth embodiments, which are equipped with an output signal stabilizing circuit 104 and 105, are each constituted of five transistors. The sixth, eight, tenth and twelfth embodiments, which are equipped with such an output signal stabilizing circuit 106 108, 110 and 102, are each constituted of eith transistors. That is, with the number of inputs being n, when n=2, five transistors are needed, and when n≧3, 2n+2 transistors are required.

Therefore, a logic cicuit of this invention, even when equipped with an output signal stabilizing circuit, reduces the number of required elements in contrast with the corresponding prior art examples.

Figure 40:
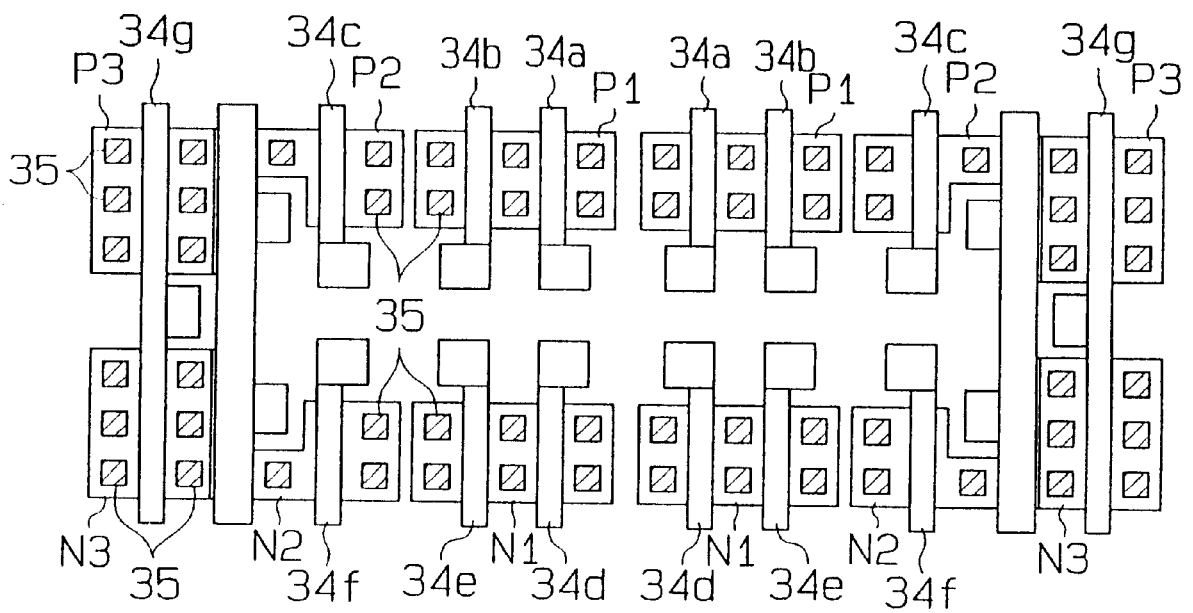
FIG. 40 is a diagram exemplifying the layout of transistors.

FIG. 40 shows the layout pattern of transistors on a chip, which includes each of the logic circuits of the sixth, eighth, tenth and twelfth embodiments.

P type diffusion regions are formed in regions P1 to P3, and N type diffusion regions are formed in regions N1 to N3. Two PMOS transistors are formed on the region P1, which have two gate electrodes 34a and 34b formed over the region P1. One PMOS transistor is formed on the region P2, which has a gate electrode 34c formed over the region P2.

Two PMOS transistors are formed on the region N1, which have two gate electrodes 34d and 34e formed over the region N1. One PMOS transistor is formed n the region N2, which has a gate electrode 34f formed over the region N2. An inverter, which has a gate electrode 34g is formed, on the regions P3 and N3.

A bulk of a logic circuit, which has three PMOS transistors and three NMOS transistors and one inverter, is formed. Multiple layout patterns, each constituting one logic circuit, are laid out regularly and in a linear symmetric fashion.

When contact holes 35 and gate electrodes 34a–34g, formed on the individual regions, and voltage supplies are properly connected by wires (not shown), the logic circuits of the sixth, eighth, tenth and twelfth embodiments are constituted.

Such a structure provides a bulk pattern common to the individual logic circuits of the sixth, eighth, tenth and twelfth embodiments, so that each logic circuit is laid out efficiently with a smaller area.

Although several embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A logic circuit for receiving a plurality of input signals each having a high or low level, wherein the circuit outputs a high or low output signal, the circuit comprising:

a plurality of MOS transistors including a first MOS transistor and a second MOS transistor, each MOS transistor having one of a first conductivity and a second conductivity, said first MOS transistor being connected to one of the plurality of input signals, said second MOS transistor being connected to a power supply, said plurality of MOS transistors operating to produce the output signal in response to an another at least one input signal of the plurality of input signals, wherein the output signal has either substantially the same level as the one input signal or the level of the power supply; and an output signal stabilizing circuit, connected between a low-potential power supply and a high-potential power supply, for stabilizing the level of the output signal between the level of the high-potential power supply and the level of the low-potential power supply.

2. The logic circuit according to claim 1, wherein the power supply is one of a low-potential power supply and a high-potential power supply.

3. The logic circuit according to claim 1, wherein the plurality of MOS transistors operate to produce an inverted output signal, wherein said output signal stabilizing circuit includes:

an inverter for receiving said inverted output signal and inverting said inverted output signal to produce the output signal; and a MOS transistor for setting the level of said inverted output signal to either the level of the high-potential powers supply or the level of the low-potential power supply in response to the output signal.

4. The logic circuit according to claim 1, the number of said plurality of MOS transistors being set to 2n−2 where n is the number of the plurality of input signals.

5. A logic circuit for receiving a plurality of input signals each having a high or low level, wherein the circuit outputs a high or low output signal, the circuit comprising:

a plurality of MOS transistors including a first MOS transistor and a second MOS transistor, each MOS transistor having one of a first conductivity and a second conductivity, said first MOS transistor being connected to one of the plurality of input signals, said second MOS transistor being connected to a power supply, said plurality of MOS transistors responsive to an another at least one input signal of the plurality of input signals, said plurality of MOS transistors being set to 2n−2 where n is the number of said plurality of input signals so that said plurality of MOS transistors operate to produce the output signal in response to the another at least one input signal; and an output signal stabilizing circuit, connected between a low-potential power supply and a high-potential power supply, for stabilizing the level of the output signal between the level of the high-potential power supply and the level of the low-potential power supply.

6. The logic circuit according to claim 5, wherein the power supply is one of a low-potential power supply and a high-potential power supply.

7. The logic circuit according to claim 5, wherein the plurality of MOS transistor operate to produce an inverted output signal, wherein said output signal stabilizing circuit includes:

an inverter for receiving said inverted output signal and inverting said inverted output signal to produce the output signal; and a MOS transistor for setting the level of said inverted output signal to either the level of the high- potential power supply or the level of the low-potential power supply in response to the output signal.

8. A logic circuit for receiving a plurality of input signals each having a high or low level, wherein the circuit outputs a high or low output signal, the circuit comprising:

a plurality of MOS transistors including a first MOS transistor and a second MOS transistor, each MOS transistor having one of a first conductivity and a second conductivity, said first MOS transistor being connected to one of the plurality of input signals, said second MOS transistor being connected to a power supply, said plurality of MOS transistors being responsive to an another at least one input signal of the plurality of input signals, said plurality of MOS transistors operate to produce the output signal in response to the another at least one input signal; and an output signal stabilizing circuit, connected between a low-potential power supply and a high-potential power supply, for stabilizing the level of the output signal between the level of the high-potential power supply and the level of the low-potential power supply.

9. The logic circuit according to claim 8, wherein the power supply is one of a low-potential power supply and a high-potential power supply.

10. The logic circuit according to claim 8, wherein the plurality of MOS transistors operate to produce an inverted output signal, wherein said output signal stabilizing circuit includes:

a inverter for receiving said inverted output signal and inverting said inverted output signal to produce the output signal; and a MOS transistor for setting the level of said inverted output signal to either the level of the high- potential power supply or the level of the low-potential power supply in response to the output signal.

11. The logic circuit according to claim 8, the number of said plurality of MOS transistors being set to 2n−2 where n is the number of the plurality of input signals.

12. A logic circuit for receiving first and second input signals each having a high or low level, wherein the circuit outputs a high or low output signal, the circuit comprising:

a P channel MOS transistor having first and second terminals and a first control terminal for receiving said second input signal;

an N channel MOS transistor having third and fourth terminals and a second control terminal for receiving said second input signal, said third terminal being connected to said first terminal, said second and fourth terminals being connected to said first input signal and one of a high-potential power supply and a low-potential power supply respectively, said P channel MOS transistor and said N channel MOS transistor operating to generate the output signal at a node between said first and third terminals in response to said second input signal, wherein the output signal has either substantially the same level as the first input signal or a level of one of the high-potential power supply and the low-potential power supply; and an output signal stabilizing circuit, connected between the high-potential power supply and the low-potential power supply, for stabilizing the level of the output signal between the level of the high-potential power supply and the level of the low-potential power supply.

13. The logic circuit according to claim 12, wherein said second terminal of said P channel MOS transistor is connected to said high-potential power supply, said fourth terminal of said N channel transistor is connected to said first input signal, said P channel MOS transistor and said N channel MOS transistor generates an inverted output signal at said node, wherein said output signal stabilizing circuit includes:

an inverter, connected to said node, for receiving the inverted signal and inverting the inverted output signal to produce the output signal; and a P channel MOS transistor, connected between said node and said high-potential power supply, for providing the level of the high-potential power supply to said node in response to the output signal, wherein said inverter produces the output signal having the level of one of said high-potential power supply and said low-potential power supply.

14. The logic circuit according to claim 13, wherein said logic circuit includes three P channel MOS transistors and two N channel MOS transistors.

15. The logic circuit according to claim 12, wherein said second terminal of said P channel MOS transistor is connected to said first input signal, said fourth terminal of said N channel transistor is connected to said low-potential power supply, said P channel MOS transistor and said N channel MOS transistor generates an inverted output signal at said node, wherein said output signal stabilizing circuit includes:

an inverter, connected to said node, for receiving the inverted output signal and inverting the inverted output signal to generate the output signal; and an N channel MOS transistor, connected between said node and said low-potential power supply, for providing the level of said low-potential power supply to said node in response to the output signal, wherein said inverter generates the output signal having the level of one of said high-potential power supply and said low-potential power supply.

16. The logic circuit according to claim 15, wherein said logic circuit includes two P channel MOS transistors and three N channel MOS transistors.

* * * * *